United States Patent
Fujita et al.

(10) Patent No.: US 9,196,794 B2
(45) Date of Patent: *Nov. 24, 2015

(54) SEMICONDUCTOR LIGHT-EMITTING DEVICE, METHOD FOR FORMING RECESSES OF THE SAME, AND LIGHT SOURCE APPARATUS USING THE SAME

(71) Applicant: Panasonic Corporation, Osaka (JP)

(72) Inventors: Toshiyuki Fujita, Osaka (JP); Akira Inoue, Osaka (JP); Toshiya Yokogawa, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 33 days.

This patent is subject to a terminal disclaimer.

(21) Appl. No.: 14/244,612

(22) Filed: Apr. 3, 2014

(65) Prior Publication Data

US 2014/0217423 A1   Aug. 7, 2014

Related U.S. Application Data

(63) Continuation of application No. PCT/JP2012/005972, filed on Sep. 20, 2012.

(30) Foreign Application Priority Data

Feb. 1, 2012   (JP) ................................ 2012-019655

(51) Int. Cl.
*H01L 29/18*   (2006.01)
*H01L 33/00*   (2010.01)
(Continued)

(52) U.S. Cl.
CPC ............. *H01L 33/32* (2013.01); *H01L 33/16* (2013.01); *H01L 33/22* (2013.01); *H01L 33/34* (2013.01); *H01L 2933/0091* (2013.01)

(58) Field of Classification Search
CPC .......... H01L 33/18; H01L 33/58; H01L 33/60
USPC ......................................... 257/88, 89, 95, 98
See application file for complete search history.

(56) References Cited

U.S. PATENT DOCUMENTS

2008/0258156 A1   10/2008   Hata
2009/0001407 A1   1/2009   Osawa et al.
(Continued)

FOREIGN PATENT DOCUMENTS

JP   2007-088273 A   4/2007
JP   2007-243047 A   9/2007
(Continued)

OTHER PUBLICATIONS

International Search Report for corresponding International Application No. PCT/JP2012/005972 mailed Oct. 23, 2012.
(Continued)

*Primary Examiner* — Nicholas Tobergte
(74) *Attorney, Agent, or Firm* — Renner, Otto, Boisselle & Sklar, LLP

(57) ABSTRACT

A semiconductor light-emitting device made of a nitride-based semiconductor includes a semiconductor stacked structure having a nonpolar plane or a semipolar plane as a principal plane, and including an active layer for emitting polarized light. The semiconductor light-emitting device includes a striped structure which is provided in a position intersecting an exit path of the polarized light and includes a plurality of recesses. An angle formed between the extension direction of the recesses and the polarization direction of the polarized light is from 0° to 45°. The recesses have a minute uneven structure (texture) at at least part of a surface of each recess, the minute uneven structure being shallower than the depth of each recess.

15 Claims, 18 Drawing Sheets

(51) Int. Cl.
  *H01L 33/32* (2010.01)
  *H01L 33/16* (2010.01)
  *H01L 33/22* (2010.01)
  *H01L 33/34* (2010.01)

(56) References Cited

U.S. PATENT DOCUMENTS

| | | |
|---|---|---|
| 2009/0065900 A1 | 3/2009 | Saito et al. |
| 2010/0072501 A1 | 3/2010 | Wakai et al. |
| 2011/0127539 A1 | 6/2011 | Komada |
| 2011/0215370 A1 | 9/2011 | Sato et al. |
| 2011/0240956 A1 | 10/2011 | Saito et al. |
| 2011/0244610 A1 | 10/2011 | Saito et al. |
| 2013/0126901 A1* | 5/2013 | Isozaki et al. .......... 257/76 |
| 2013/0126902 A1* | 5/2013 | Isozaki et al. .......... 257/76 |
| 2014/0042456 A1* | 2/2014 | Inoue et al. ............ 257/76 |

FOREIGN PATENT DOCUMENTS

| | | |
|---|---|---|
| JP | 2008-109098 A | 5/2008 |
| JP | 2008-305971 A | 12/2008 |
| JP | 2009-32900 A | 2/2009 |
| JP | 2009-239075 A | 10/2009 |
| JP | 2010-074008 A | 4/2010 |
| JP | 2010-177455 A | 8/2010 |
| JP | 2011-014936 A | 1/2011 |
| JP | 2011-211075 A | 10/2011 |
| JP | 2011-216643 A | 10/2011 |

OTHER PUBLICATIONS

Form PCT/ISA/237 for corresponding International Application No. PCT/JP2012/005972 dated Oct. 23, 2012.

International Preliminary Report on Patentability for corresponding International Application No. PCT/JP2012/005972 dated Nov. 18, 2013.

* cited by examiner $m$-PLANE $c$-PLANE

POLARIZATION DIRECTION

POLARIZATION DIRECTION

POLARIZATION DIRECTION

POLARIZATION DIRECTION

POLARIZATION DIRECTION

POLARIZATION DIRECTION

POLARIZATION DIRECTION

POLARIZATION DIRECTION $A = L1/T$
$B = L2/L1$

SEMICONDUCTOR LIGHT-EMITTING DEVICE, METHOD FOR FORMING RECESSES OF THE SAME, AND LIGHT SOURCE APPARATUS USING THE SAME

CROSS-REFERENCE TO RELATED APPLICATIONS

This is a continuation of International Application No. PCT/JP2012/005972 filed on Sep. 20, 2012, which claims priority to Japanese Patent Application No. 2012-019655 filed on Feb. 1, 2012. The entire disclosures of these applications are incorporated by reference herein.

BACKGROUND

The present disclosure relates to semiconductor light-emitting devices each including a nitride-based semiconductor stacked structure including an active layer which has a nonpolar plane or a semipolar plane as a principal plane and emits polarized light, and methods for forming recesses of the same. The present disclosure also relates to light source apparatuses using the semiconductor light-emitting devices.

Nitride semiconductors containing nitrogen (N) as a group V element have been expected as a material of a short wavelength light-emitting device because of their band gap size. Gallium nitride-based compound semiconductors, in particular, have been actively researched, and blue light-emitting diodes (LEDs), green LEDs, and blue semiconductor laser diodes that use a gallium nitride-based compound semiconductor have been also commercialized.

Gallium nitride-based compound semiconductors include a compound semiconductor obtained by substituting at least one of aluminum (Al) or indium (In) for part of gallium (Ga). Such a nitride semiconductor is represented by the general formula $Al_xGa_yIn_zN$ (where $0 \leq x < 1$, $0 < y \leq 1$, $0 \leq z < 1$, and $x+y+z=1$). The gallium nitride-based compound semiconductors are hereinafter referred to as GaN-based semiconductors.

The replacement of Ga atoms with Al atoms in a GaN-based semiconductor allows the band gap of the GaN-based semiconductor to be wider than that of GaN, and the replacement of Ga atoms with In atoms in a GaN-based semiconductor allows the band gap of the GaN-based semiconductor to be narrower than that of GaN. Thus, not only short wavelength light, such as blue or green light, but also long wavelength light, such as orange or red light, can be emitted. From such a feature, nitride semiconductor light-emitting devices have been expected to be used for, e.g., image display devices and lighting devices.

Nitride semiconductors have a wurtzite crystal structure. In FIGS. 1A, 1B, and 1C, the plane orientations of the wurtzite crystal structure are expressed in four-index notation (hexagonal indices). In four-index notation, crystal planes and the orientations of the planes are expressed using primitive vectors expressed as a1, a2, a3, and c. The primitive vector c extends in a [0001] direction, and an axis in this direction is referred to as a "c-axis." A plane perpendicular to the c-axis is referred to as a "c-plane" or a "(0001) plane." FIG. 1A illustrates, not only the c-plane, but also an a-plane (=(11–20) plane) and an m-plane (=(1–100) plane). FIG. 1B illustrates an r-plane (=(1–102) plane), and FIG. 1C illustrates a (11–22) plane. Herein, the symbol "–" attached to the left of one of parenthesized numbers indicating the Miller indices expediently indicates inversion of the number, and corresponds to each of "bars" in some of the drawings.

FIG. 2A illustrates a crystal structure of a GaN-based semiconductor using a ball-and-stick model. FIG. 2B is a ball-and-stick model obtained by observing atomic arrangement in the vicinity of the m-plane surface from an a-axis direction. The m-plane is perpendicular to the plane of the paper of FIG. 2B. FIG. 2C is a ball-and-stick model obtained by observing atomic arrangement of a +c-plane surface from an m-axis direction. The c-plane is perpendicular to the plane of the paper of FIG. 2C. As seen from FIGS. 2A and 2B, N atoms and Ga atoms are located on a plane parallel to the m-plane. On the other hand, as seen from FIGS. 2A and 2C, a layer in which only Ga atoms are located, and a layer in which only N atoms are located are formed on the c-plane.

Conventionally, when a semiconductor device is to be fabricated using a GaN-based semiconductor, a c-plane substrate, i.e., a substrate having a (0001) plane as its principal plane, has been used as a substrate on which a nitride semiconductor crystal is grown. In this case, spontaneous electrical polarization is formed in the nitride semiconductor along the c-axis due to the arrangements of Ga and N atoms. Thus, the "c-plane" is referred to as a "polar plane." As a result of the electrical polarization, a piezoelectric field is generated along the c-axis in an InGaN quantum well layer forming a portion of a light-emitting layer of a nitride semiconductor light-emitting device. Due to the generated piezoelectric field, the distributed electrons and holes in the light-emitting layer are displaced, and the internal quantum efficiency of the light-emitting layer is decreased due to a quantum-confined Stark effect of carriers. In order to reduce the decrease in the internal quantum efficiency of the light-emitting layer, the light-emitting layer formed on the (0001) plane is designed to have a thickness of not more than 3 nm.

Furthermore, in recent years, consideration has been made to fabricate a light-emitting device using a substrate having an m- or a-plane called a nonpolar plane, or a –r- or (11–22) plane called a semipolar plane as its principal plane. As illustrated in FIG. 1A, m-planes of the wurtzite crystal structure are parallel to the c-axis, and are six equivalent planes orthogonal to the c-plane. For example, in FIG. 1A, a (1–100) plane perpendicular to a [1–100] direction corresponds to one of the m-planes. The other m-planes equivalent to the (1–100) plane include a (–1010) plane, a (10–10) plane, a (–1100) plane, a (01–10) plane, and a (0–110) plane.

As illustrated in FIGS. 2A and 2B, Ga and N atoms on the m-planes are present on the same atomic plane, and thus, electrical polarization is not induced in directions perpendicular to the m-planes. Therefore, when a light-emitting device is fabricated using a semiconductor stacked structure having an m-plane as its growth surface, a piezoelectric field is not generated in a light-emitting layer, and the problem where the internal quantum efficiency is decreased due to the quantum-confined Stark effect of carriers can be solved. This applies also to the a-plane that is a nonpolar plane except the m-planes, and furthermore, even when the –r-plane, the (11–22) plane, a (20–21) plane, or a (20–2–1) plane called the semipolar plane is used as the growth surface, instead of the m-plane, similar advantages can be provided.

A nitride-based semiconductor light-emitting device including an active layer having a nonpolar- or semipolar plane as a growth surface (principal plane) has polarization characteristics resulting from the structure of the valence band thereof.

Japanese Unexamined Patent Publication No. 2008-109098 describes a light-emitting diode device aiming at reducing variations in the intensity of light due to the variations among the in-plane azimuth angles of light in a chip-arrangement surface. The light-emitting diode device includes light-emitting diode chips each including a light-emitting layer having a principal plane, and a package having a chip-arrangement surface on which the light-emitting diode chips are arranged. The light-emitting diode device has a configuration in which light emitted from the principal plane of the light-emitting layer has a plurality of different intensities of the light depending on the in-plane azimuth angles in the principal plane of the light-emitting layer, and at least either of the light-emitting diode chips or the package reduce variations in the intensity of light exiting from the package due to the variations among the in-plane azimuth angles of the light in the chip-arrangement surface.

Japanese Unexamined Patent Publication No. 2010-074008 describes a semiconductor light-emitting device aiming at obtaining high light extraction efficiency at which light is extracted from a surface of a light extraction side of the semiconductor light-emitting device and a good light distribution. The semiconductor light-emitting device includes a plurality of concaves provided on a light extraction surface of a semiconductor stack opposite to a surface to be mounted on a substrate, the semiconductor stack including a light-emitting layer between an n-type semiconductor layer and a p-type semiconductor layer. Each concave has two slopes having different slope angles in a direction in which the diameter of the concave is reduced from an opening of the concave toward a bottom of the concave. One of the slopes which has a gentle slope angle is a slope provided with irregularities, and the other of the slopes which has a steep slope angle is a flat surface.

Japanese Unexamined Patent Publication No. 2008-305971 describes a light-emitting device aiming at limiting the reduction in power efficiency of polarized light generated in an active layer. The light-emitting device includes a light-emitting section and an output section. The light-emitting section is made of a group III nitride semiconductor including a nonpolar plane or a semipolar plane as a principal plane, and includes a first semiconductor layer of a first conductivity type, an active layer, and a second semiconductor layer of a second conductivity type stacked in this order to emit polarized light from the active layer. In the output section, a plurality of stripe-like grooves extending in a direction vertical to the polarization direction of the polarized light are arranged in the polarization direction, so that the output section serves as an output surface having a sawtooth waveform. Light from the light-emitting section is transmitted through the output section, so that polarized light is output from the output surface.

Japanese Unexamined Patent Publication No. 2010-177455 aims at providing a long-life and highly reliable nitride semiconductor device including a substrate back electrode exhibiting good ohmic contact performance, high adhesiveness, and high heat resistance while the flatness of a back surface of a nitride semiconductor substrate is maintained. This nitride semiconductor device includes the nitride semiconductor substrate including a first surface and a second surface facing each other, an device structure provided on the first surface, and an electrode provided on the second surface. Grooves provided with irregularities on bottoms of the grooves and a nitrogen polar flat portion are provided on the second surface. The electrode is provided to cover the grooves.

SUMMARY

However, it has been required to improve the performance of emission operation of such conventional light-emitting devices each including a nitride semiconductor having a nonpolar plane or a semipolar plane as a principal plane as described in Japanese Unexamined Patent Publication No. 2008-109098 and Japanese Unexamined Patent Publication No. 2008-305971.

In view of the foregoing, it is an object of the present disclosure to improve the performance of emission operation.

In order to achieve the object, an aspect of the present disclosure is a semiconductor light-emitting device including a nitride-based semiconductor stacked structure including an active layer which has a nonpolar plane or a semipolar plane as a principal plane and emits polarized light; and a striped structure which is provided in a position intersecting an exit path of the polarized light and includes a plurality of recesses extending parallel to each other, wherein an angle formed between an extension direction of the recesses and a polarization direction of the polarized light is not less than 0° and not more than 45°, and a texture is provided at at least part of a surface of each recess, a depth of the texture being shallower than a depth of each recess.

The present invention can more appropriately control anisotropy of the intensity of emitted light.

DETAILED DESCRIPTION

Figure 1A:
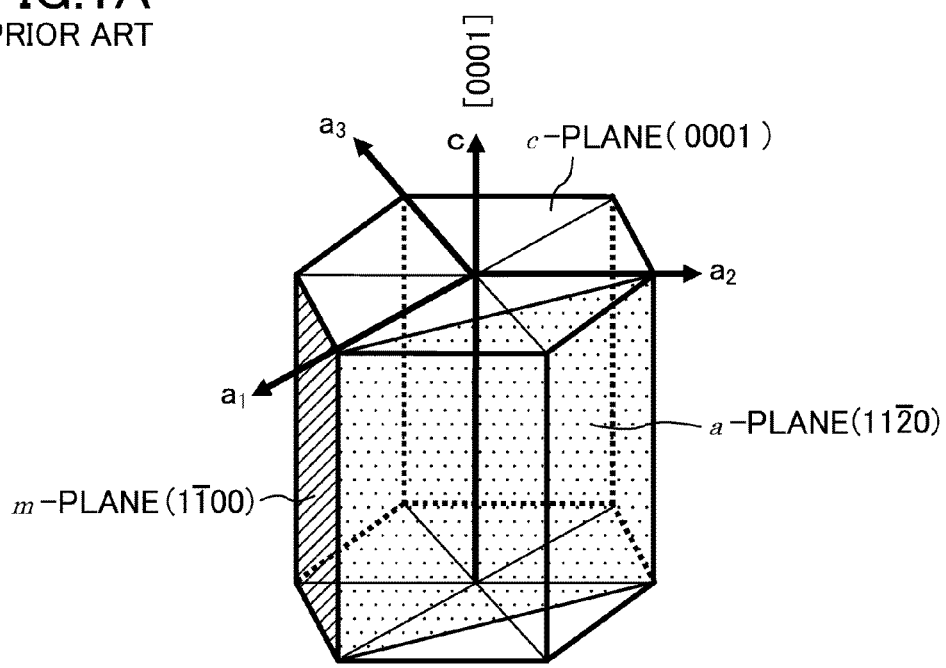
FIG. 1A is a perspective view illustrating primitive vectors a1, a2, a3, and c, and a-, c-, and m-planes of a wurtzite crystal structure.
Figure 1B:
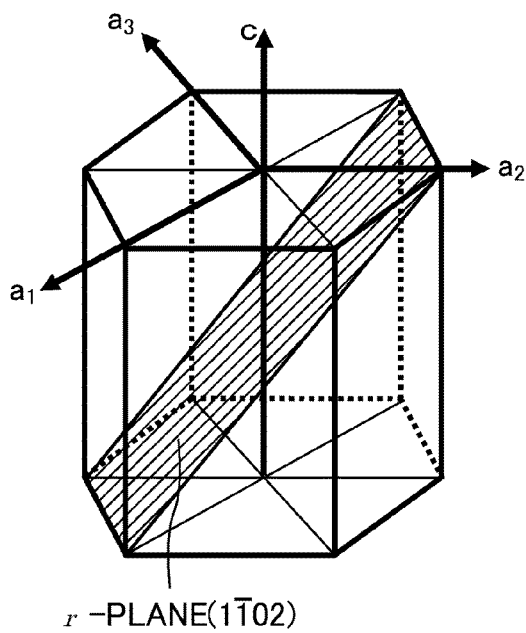
FIG. 1B is a perspective view illustrating an r-plane of the wurtzite crystal structure.
Figure 1C:
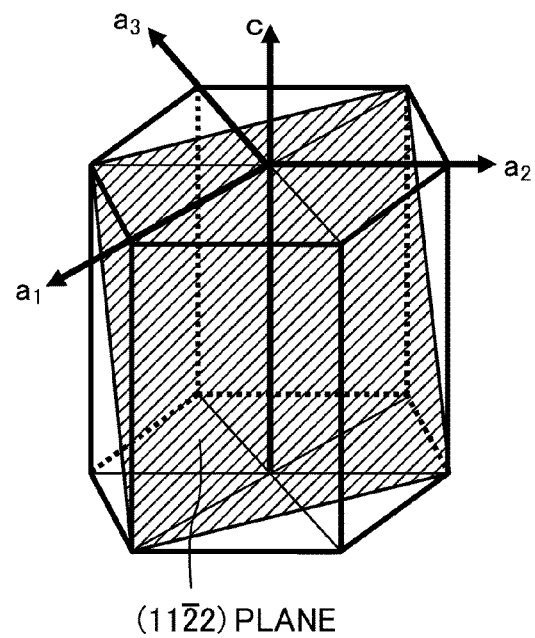
FIG. 1C is a perspective view illustrating a (11–22) plane of the wurtzite crystal structure.
Figure 2A:
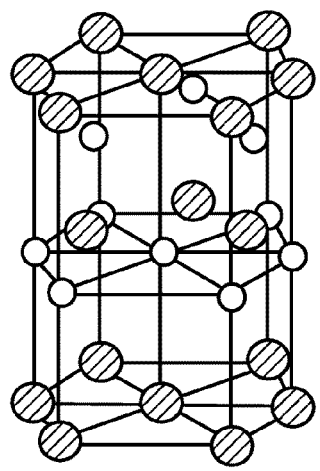
FIGS. 2A-2C illustrate a crystal structure of a GaN-based semiconductor using a ball-and-stick model.
Figure 2A:
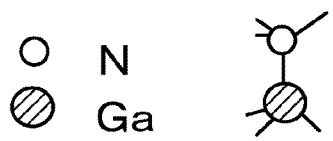
Figure 2B:
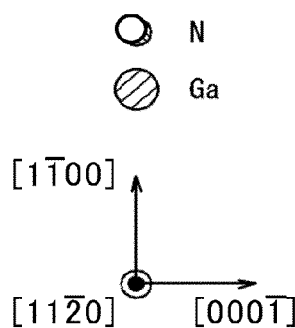
Figure 2B:
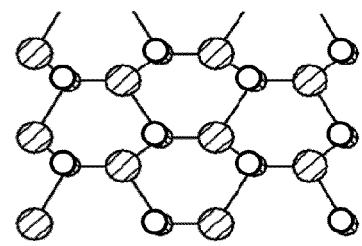
Figure 2C:
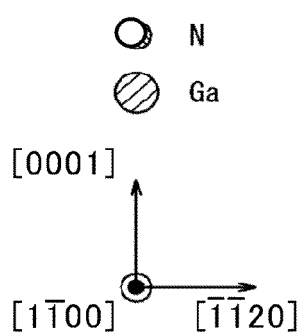
Figure 2C:
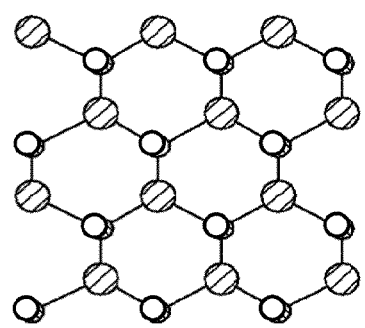

An embodiment of the present disclosure is a semiconductor light-emitting device including a nitride-based semiconductor stacked structure including an active layer which has a nonpolar plane or a semipolar plane as a principal plane and emits polarized light; and a striped structure which is provided in a position intersecting an exit path of the polarized light and includes a plurality of recesses extending parallel to each other, wherein an angle formed between an extension direction of the recesses and a polarization direction of the polarized light is not less than 0° and not more than 45°, and a texture is provided at at least part of a surface of each recess, a depth of the texture being shallower than a depth of each recess.

The semiconductor light-emitting device may further include a substrate by which the nitride-based semiconductor stacked structure is held, wherein the striped structure may be provided in the substrate.

The depth of each recess may be not more than ½ of a thickness of the substrate.

The semiconductor light-emitting device may further include a light-transmissive member, wherein the striped structure may be provided in the light-transmissive member.

The semiconductor light-emitting device may further include a substrate on which the nitride-based semiconductor stacked structure is grown, wherein the light-transmissive member may be provided on a surface of the substrate opposite to the nitride-based semiconductor stacked structure.

The substrate may be composed of gallium nitride, sapphire, or silicon carbide.

A region between the recesses adjacent to each other may be flat.

The angle formed between the extension direction of the recesses and the polarization direction of the polarized light may be not less than 0° and not more than 25°.

The depth of each recess may be not less than λ/0.628, where λ is a wavelength of the polarized light.

L2/L1 may be not more than 1.7, where L2 is a distance between the recesses adjacent to each other, and L1 is a width of each recess.

The linear cross-section roughness Ra of the texture in the extension direction of the recesses may be not less than λ/30 and not more than λ×5, where λ is a wavelength of the polarized light.

The principal plane of the nitride-based semiconductor stacked structure may be an m-plane, and the polarization direction may be an a-axis direction.

Another embodiment of the present disclosure is a method for fabricating the semiconductor light-emitting device, the method including forming the recesses and the texture at the surface of each recess by thermal melting.

The thermal melting may be caused by laser irradiation.

The scanning speed of a laser beam used for the laser irradiation may be not less than 200 mm/s.

Another embodiment of the present disclosure is a light source apparatus including the semiconductor light-emitting device, and a wavelength converter containing a fluorescent material converting a wavelength of light output from the semiconductor light-emitting device.

Incidentally, a nitride semiconductor active layer having an m-plane as a principal plane (growth surface) emits light having a high electric field intensity principally along the a-axis. When a light-emitting device has polarization characteristics, it is theoretically predicted that the light emitted from the light-emitting device will exhibit the luminous intensity distribution where the intensity of the emitted light increases in a direction perpendicular to the polarization direction of the light. In other words, the light emitted from the light-emitting device exhibits an uneven radiation (luminous intensity distribution) pattern. Furthermore, it is theoretically predicted that light having a high electric field intensity along a specific crystal direction of a nitride semiconductor will be emitted also from each of semipolar planes, such as –r-, (20–21), (20–2–1), (10–1–3), and (11–22) planes, and other nonpolar planes, such as a-planes, and the emitted light will exhibit the luminous intensity distribution where the intensity of the emitted light increases in a direction perpendicular to the polarization direction of the light.

The polarization direction of light from a nitride semiconductor active layer having an a-plane as a principal plane has been known to be along the m-axis. Therefore, it is predicted that the light will exhibit the luminous intensity distribution where the intensity of the emitted light increases in a direction perpendicular to the m-axis.

The polarization direction of light from a nitride semiconductor active layer having a (20–2–1) or (20–21) plane that is a semipolar plane as a principal plane has been known to correspond to the (–12–10) direction. Therefore, it is predicted that the light will exhibit the luminous intensity distribution where the intensity of the emitted light increases in a direction perpendicular to the (–12–10) direction.

When the In content of a nitride semiconductor active layer having a (10–1–3) plane that is a semipolar plane as a principal plane is high, the polarization direction of light from the nitride semiconductor active layer has been known to be the (–12–10) direction, and when the In content of the nitride semiconductor active layer is low, the polarization direction of the light has been known to be the (–1–123) direction. Therefore, it is predicted that the light will exhibit the luminous intensity distribution where when the In content of the active layer is high, the intensity of the emitted light increases in a direction perpendicular to the (–12–10) direction, and when the In content of the active layer is low, the intensity of the emitted light increases in a direction perpendicular to the (–1–123) direction.

When the In content of a nitride semiconductor active layer having a (11–22) plane that is a semipolar plane as a principal plane is high, the polarization direction of light from the nitride semiconductor active layer has been known to be along the m-axis, and when the In content of such a nitride semiconductor active layer is low, the polarization direction of the light has been known to correspond to the (–1–123) direction. Therefore, it is predicted that the light will exhibit the intensity distribution where when the In content of the active layer is high, the intensity of the emitted light increases in a direction perpendicular to the m-axis, and when the In content of the active layer is low, the intensity of the emitted light increases in a direction perpendicular to the (–1–123) direction.

Light having a high electric field intensity along a specific direction is herein referred to as "polarized light." For example, light having a high electric field intensity along a V-axis is referred to as "polarized light along the V-axis," and in this case, a direction along the V-axis is referred to as a "polarization direction." The "polarized light along the V-axis" does not mean only linearly polarized light along the V-axis, and may include linearly polarized light along other axes. More specifically, the "polarized light along the V-axis" means light including a light component that transmits through a "polarizer having a polarization transmission axis along the V-axis" and has higher intensity (electric field intensity) than a light component transmitting through a "polarizer having a polarization transmission axis along another axis." Therefore, the "polarized light along the V-axis" includes incoherent light including not only linearly polarized light and elliptically polarized light along the V-axis, but also linearly polarized light and elliptically polarized light in various directions.

As described in Japanese Unexamined Patent Publication No. 2008-109098, a nitride semiconductor light-emitting device may have anisotropy of the intensity of emitted light at an in-plane azimuth angle of a principal plane due to the polarization characteristics. Thus, appropriate control over the polarization characteristics and appropriate control over the anisotropy of intensity of emitted light have been required as the characteristics of the light-emitting device in addition to high output of light.

The light-emitting diode device described in Japanese Unexamined Patent Publication No. 2008-109098 aims at reducing variations in the intensity of light which are caused due to the difference among the in-plane azimuth angles of the light in a chip-arrangement surface. However, no consideration has been given to the degree of polarization of light.

The semiconductor light-emitting device described in Japanese Unexamined Patent Publication No. 2010-074008 aims at improving the light output, and Japanese Unexamined Patent Publication No. 2010-074008 describes a configuration which includes an inclined surface formed by performing dry etching on a light extraction surface and minute unevenness formed by wet etching using crystal anisotropy. The wet etching is effective at the –c-plane. However, it is difficult to apply the wet etching to a nonpolar plane and a semipolar plane.

The light-emitting device described in Japanese Unexamined Patent Publication No. 2008-305971 aims at increasing extraction of light with the degree of polarization of light being maintained, and includes the stripe-like grooves extending in a direction perpendicular to the polarization direction of light from the active layer. However, through detailed study of the present inventors, they have found that the density of light incident on an output surface at the Brewster angle is very low, and that the effect of the grooves on improvement of the transmittance of polarized light is very limited.

The nitride semiconductor device described in Japanese Unexamined Patent Publication No. 2010-177455 aims at improving the adhesiveness and the heat resistance of an n-side electrode formed in the −c-plane, wherein a groove having a depth of about 2-10 μm is formed in the −c-plane by using a pulse laser beam, and then the n-side electrode is formed. In the groove, recesses/projections are formed to have a level difference of 0.1-0.3 μm and at a period of 3-5 μm. However, the entire groove is covered with the electrode, and no consideration is given to the effect of the recesses/projections in the groove on light output.

The present inventors found that when the shape (cross-sectional shape) of an output surface of a nitride semiconductor light-emitting device including polarized light is optimized, the polarization characteristics and the luminous intensity characteristics of output light can be improved, and simultaneously the light extraction efficiency can be improved.

Embodiments of the present disclosure will be described below with reference to the drawings. In the following figures, the same reference symbols may be used to designate elements performing substantially the same functions for the sake of brevity of description. The present disclosure is not limited to the following embodiments.

First Embodiment

With reference to the drawings, a first embodiment will be described below.

Figure 3A:
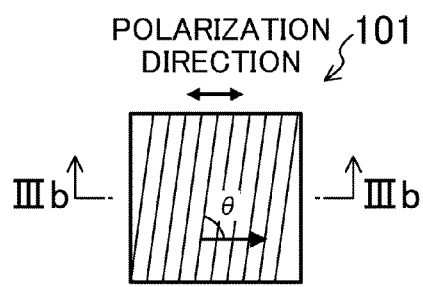
FIG. 3A is a plan view schematically illustrating projections and recesses of a striped structure provided to a semiconductor light-emitting device according to a first embodiment.
Figure 3B:
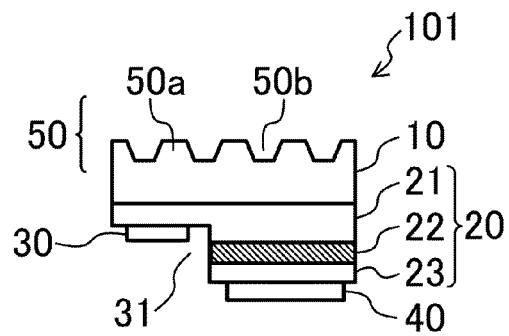
FIG. 3B is a schematic cross-sectional view along the line IIIb-IIIb of FIG. 3A.
Figure 3C:
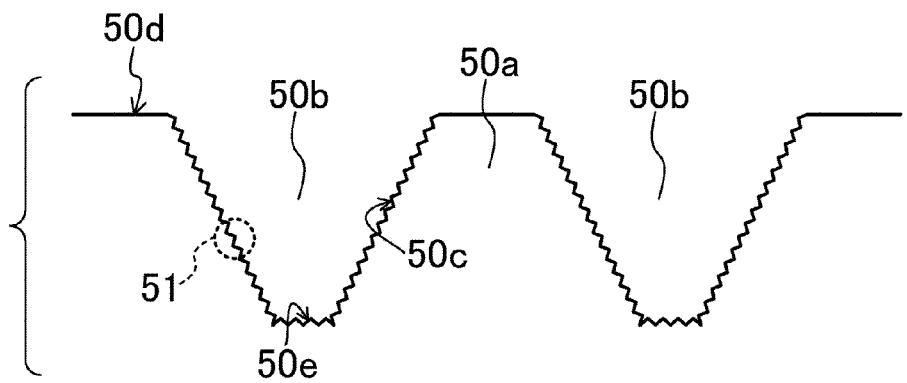
FIGS. 3C and 3D are enlarged cross-sectional views partially illustrating the projections and the recesses of FIG. 3B.
Figure 3D:
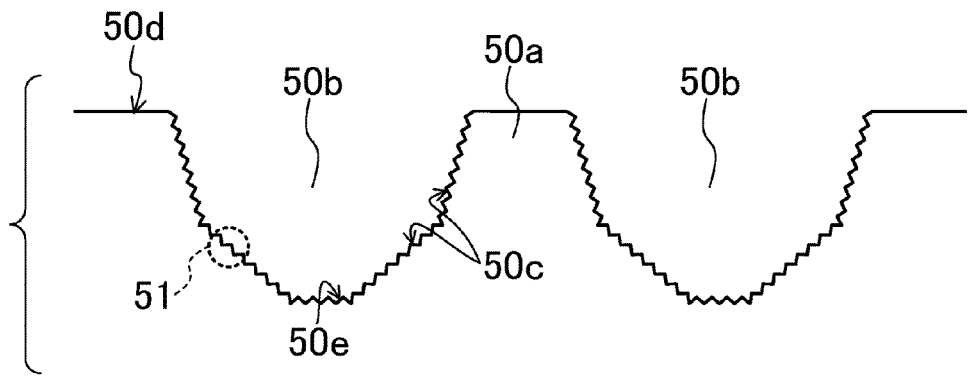

FIGS. 3A-3D schematically illustrate a semiconductor light-emitting device according to the first embodiment. FIG. 3A illustrates a plan configuration, FIG. 3B illustrates a cross-sectional configuration taken along the line IIIb-IIIb of FIG. 3A, and FIGS. 3C and 3D are enlarged views each illustrating a striped structure 50.

As illustrated in FIGS. 3A and 3B, a semiconductor light-emitting device 101 according to the present embodiment includes a substrate 10 and a semiconductor stacked structure 20 formed on the substrate 10 and including an active layer 22.

The configuration of the semiconductor light-emitting device 101 according to the first embodiment will be described in detail below.

The semiconductor light-emitting device 101 according to the first embodiment includes the semiconductor stacked structure 20 including the active layer 22 made of a nitride-based semiconductor and having a nonpolar plane or a semipolar plane as a principal plane. As described above, the active layer 22 emits polarized light.

The semiconductor stacked structure 20 is made of a nitride semiconductor, more specifically, made of an $Al_xIn_yGa_zN$ (where $x+y+z=1$, $x \geq 0$, $y \geq 0$, and $z \geq 0$) semiconductor. The semiconductor stacked structure 20 includes an n-type nitride semiconductor layer 21 and a p-type nitride semiconductor layer 23 between which the active layer 22 is sandwiched. An undoped GaN layer may be provided at least one of between the active layer 22 and the n-type nitride semiconductor layer 21 or between the active layer 22 and the p-type nitride semiconductor layer 23.

The semiconductor light-emitting device 101 includes an n-side electrode 30 electrically connected to the n-type nitride semiconductor layer 21 and a p-side electrode 40 electrically connected to the p-type nitride semiconductor layer 23. In the present embodiment, a recess 31 is provided to expose part of the n-type nitride semiconductor layer 21 of the semiconductor stacked structure 20. The n-side electrode 30 is provided on the exposed part of the n-type nitride semiconductor layer 21. The n-side electrode 30 is made of, for example, a layered structure (Ti/Pt) in which a titanium (Ti) layer and a platinum (Pt) layer are stacked. Instead, a layered structure (Ti/Al) in which a titanium (Ti) layer and an aluminum (Al) layer are stacked may be used for the n-side electrode 30.

On the p-type nitride semiconductor layer 23, the p-side electrode 40 is provided. The p-side electrode 40 may cover substantially the entire surface of the p-type nitride semiconductor layer 23. The p-side electrode 40 is made of, for example, a layered structure (Pd/Pt) in which a palladium (Pd) layer and a platinum (Pt) layer are stacked. Instead, a silver (Ag) layer may be used for the p-side electrode 40.

A material suitable for formation of the semiconductor stacked structure 20 having a nonpolar plane or a semipolar plane as a principal plane is selected for the substrate 10. Specifically, gallium nitride (GaN) can be used. Instead of GaN, gallium oxide ($Ga_2O_3$), silicon carbide (SiC), silicon (Si), or sapphire can be used. For example, when a semiconductor stacked structure 20 including an active layer 22 having an m-plane as a principal surface is epitaxially grown on a principal plane of the substrate 10, an m-plane GaN substrate can be used. When a semiconductor stacked structure 20 including an active layer 22 having a (20−2−1) plane as a principal surface is epitaxially grown on a principal plane of the substrate 10, a (20−2−1) plane GaN substrate may be used. An m-plane SiC substrate or an m-plane sapphire substrate may be used. However, as it has been reported that an a-plane GaN grows on an r-plane sapphire substrate, it is not essential for the surface of the substrate 10 to be an m-plane for growth of an active layer 22 having an m-plane as a principal plane. After a semiconductor stacked structure 20 is formed on a substrate other than the substrate 10, the semiconductor stacked structure 20 is removed from the substrate, and then the semiconductor stacked structure 20 may be bonded to the substrate 10.

The n-type nitride semiconductor layer 21 is made of, for example, an n-type $Al_uGa_vIn_wN$ (where $u+v+w=1$, $u \geq 0$, $v \geq 0$, and $w \geq 0$) semiconductor. For example, silicon (Si) can be used as an n-type dopant. Instead of Si, for example, oxygen (O) may be used as the n-type dopant.

The p-type nitride semiconductor layer 23 is made of, for example, a p-type $Al_sGa_tN$ (where $s+t=1$, $s \geq 0$, and $t \geq 0$) semiconductor. For example, magnesium (Mg) can be used as a p-type dopant. Instead of Mg, for example, zinc (Zn) or beryllium (Be) may be used as the p-type dopant. The Al content s of the p-type nitride semiconductor layer 23 may be uniform along the thickness thereof, or may vary along the thickness thereof in a continuous or stepwise manner. Specifically, the thickness of the p-type nitride semiconductor layer 23 is, for example, about 0.1-2 μm.

The Al content s of a portion of the p-type nitride semiconductor layer 23 near the interface between the p-type nitride semiconductor layer 23 and the p-side electrode 40 may be 0, that is, the portion of the p-type nitride semiconductor layer 23 near the interface between the p-type nitride semiconductor layer 23 and the p-side electrode 40 may be made of GaN. In this case, GaN may contain a high concentration of p-type impurities, and may function as a p-type contact layer. Therefore, although not shown, a contact layer made of $p^+$-GaN may be provided between the p-type nitride semiconductor layer 23 and the p-side electrode 40.

The active layer 22 has a multiple quantum well (MQW) structure made of GaInN/GaN. In the MQW structure, for example, $Ga_{1-x}In_xN$ well layers (where $0 < x < 1$) each having a thickness of about 3-20 nm and GaN barrier layers each having a thickness of about 5-30 nm are alternately stacked. The wavelength of light emitted from the semiconductor light-emitting device 101 depends on the band gap size of a nitride semiconductor included in the active layer 22, specifically, the In content x of an $Ga_{1-x}In_xN$ semiconductor that is a semiconductor composition of the well layer.

The substrate 10 has a first principal plane and a second principal plane facing each other, and the first principal plane is in contact with the n-type nitride semiconductor layer 21 of the semiconductor stacked structure 20. The second principal plane serves as an output surface from which polarized light emitted from the active layer 22 is extracted. In the present embodiment, the striped structure 50 in which a plurality of projections and a plurality of recesses extend parallel to each other in a striped pattern is formed at the second principal plane serving as the output surface of light.

As illustrated in FIG. 3A, the extension direction of the striped structure when viewed in plan forms an angle θ relative to the polarization direction of light from the active layer 22. As illustrated in FIG. 3B, the striped structure 50 includes projections 50a and recesses 50b. A feature of the present embodiment is, as illustrated in FIGS. 3C and 3D, that minute uneven structures 51 are provided at surfaces of the recesses 50b. The minute uneven structure 51 has a sufficiently smaller cross-sectional shape than the recesses 50b formed at the second principal plane of the substrate 10. In the present specification, the minute uneven structure 51 formed at least at the surface of each recess 50b is also referred to as "texture."

Each projection 50a has a top surface 50d substantially parallel to the second principal plane serving as the output surface. Each recess 50b has at least one inclined surface 50c non-parallel to the top surface 50d and a bottom surface 50e. In the present specification, the inclined surface 50c and the bottom surface 50e of the recess 50b may also be collectively referred to hereinafter as an inner surface. As illustrated in FIG. 3D, the inclined surface 50c may include a plurality of inclined surfaces. The striped structure 50 may have a configuration having no top surface 50d or a configuration having no bottom surface 50e. The inclined surface 50c and the bottom surface 50e may be curves. The striped structure 50 does not need to be formed at the entire second principal plane, but may be formed at part of the second principal plane.

As illustrated in FIGS. 4A-4H, the projections 50a and the recesses 50b of the striped structure 50 can have various shapes. FIGS. 4A-4H are views illustrating example planar shapes and cross-sectional shapes of the striped structure 50. Here, attention is focused only on the striped structure 50, and the minute uneven structures (textures) 51 provided to the recesses 50b are omitted.

Figure 4A:
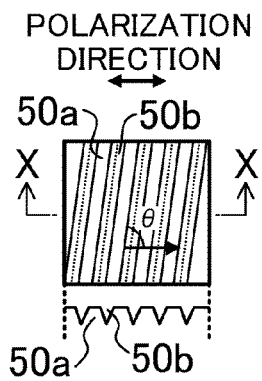
FIGS. 4A-4H are each a plan and cross-sectional view of the striped structure provided to the semiconductor light-emitting device according to the first embodiment, wherein the plan view schematically illustrates the extension direction of the striped structure, and the cross-sectional view schematically illustrates the striped structure along the line X-X of the plan view.

For example, FIG. 4A shows an example in which each of projections 50a has a trapezoidal cross-sectional shape, and each of recesses 50b has a triangular cross-sectional shape. This is a structure having no bottom surface 50e.

Figure 4B:
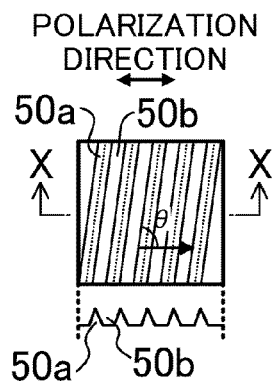

FIG. 4B shows an example in which each of projections 50a has a triangular cross-sectional shape, and each of recesses 50b has a trapezoidal cross-sectional shape. This is a structure having no top surface 50d.

Figure 4C:
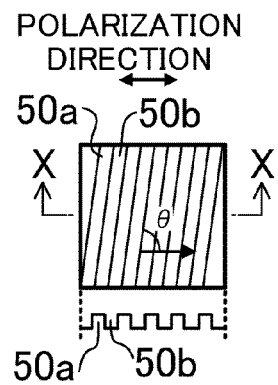

FIG. 4C shows an example in which each of projections 50a and each of recesses 50b have a square cross-sectional shape.

Figure 4D:
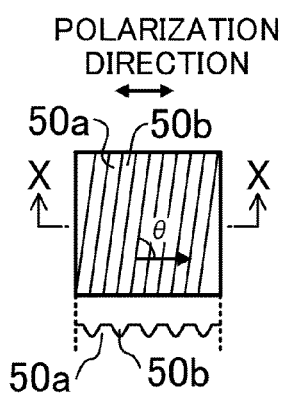

FIG. 4D shows an example in which each of recesses 50b has a curved cross-sectional shape, and each of projections 50a has a top surface 50d.

Figure 4E:
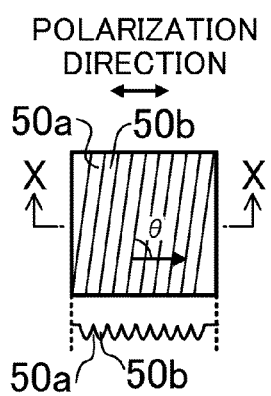

FIG. 4E shows an example in which each of recesses 50b has a curved cross-sectional shape, and each of projections 50a has no top surface 50d.

Figure 4F:
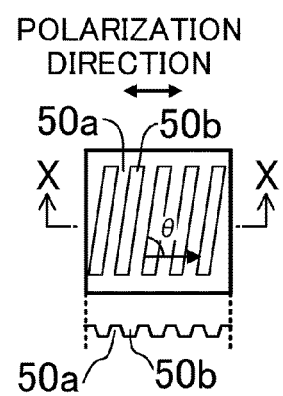

FIG. 4F shows an example in which recesses 50b are formed at part of the second principal plane.

Figure 4G:
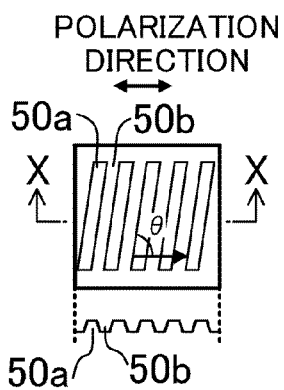

FIG. 4G shows an example in which projections 50a are formed at part of the second principal plane.

Figure 4H:
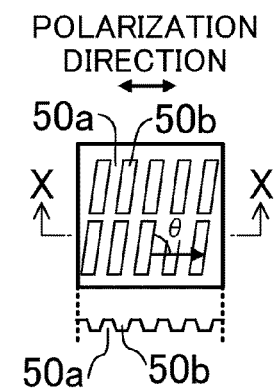

FIG. 4H shows an example in which stripe-like recesses 50b are discontinuously formed.

The above examples illustrate the cross-sectional shapes and the planar shapes of the striped structure 50. In the present disclosure, the striped structure 50 provided at the second principal plane of the substrate 10 is a recess/protrusion structure body disposed to extend in a predetermined direction when viewed in plan, and may include the minute uneven structures (textures) 51 in the recesses.

The characteristics of the striped structure 50 will be described below in detail.

When attention is focused on the feature that light propagates in a direction perpendicular to the polarization direction, the angle θ formed between the extension direction of the striped structure 50 and the polarization direction of light from the active layer 22 has a significant meaning Next, this will be described with reference to FIGS. 5A-5E and FIG. 6.

Figure 5A:
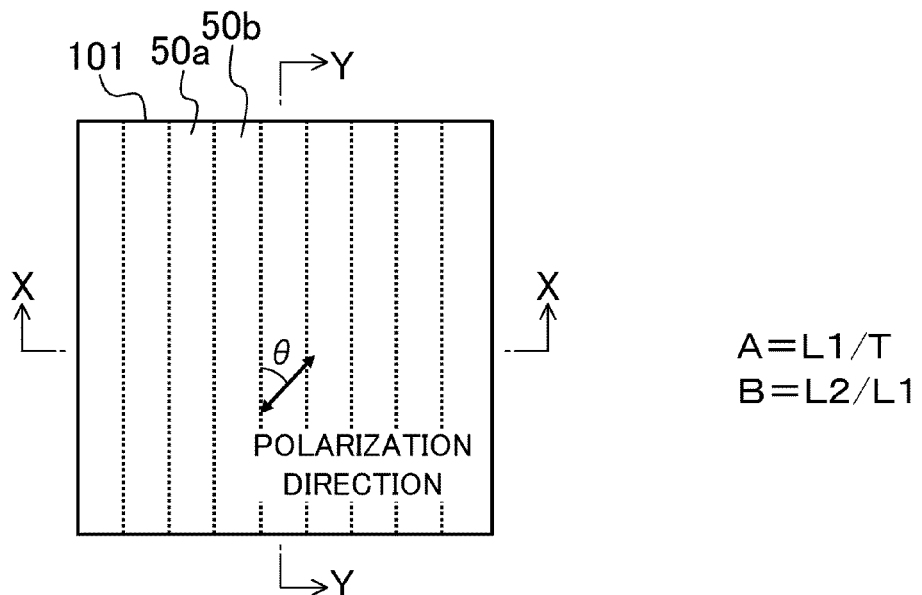
FIG. 5A is a plan view schematically illustrating the extension direction of a striped structure of the semiconductor light-emitting device according to the first embodiment used for simulative calculation.
Figure 5B:
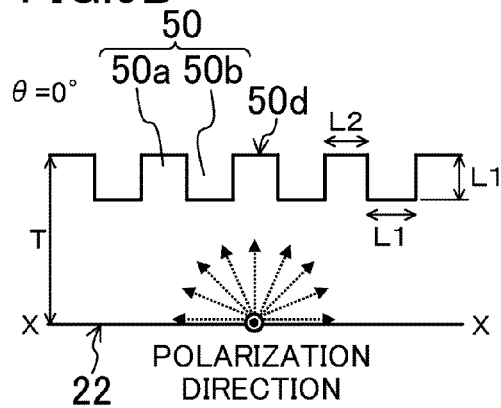
FIGS. 5B and 5D are cross-sectional views schematically illustrating the striped structure along the line X-X of FIG. 5A, and FIGS. 5C and 5E are cross-sectional views schematically illustrating the striped structure along the line Y-Y of FIG. 5A.
Figure 5C:
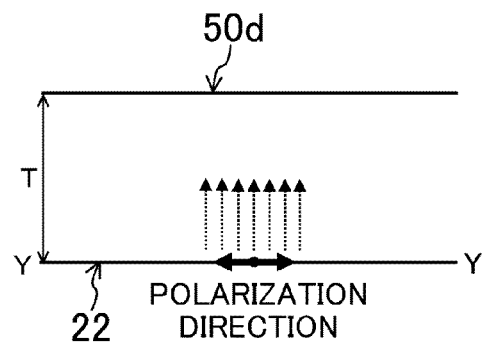
Figure 5D:
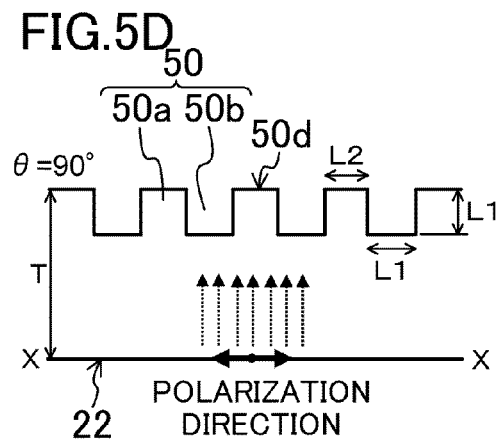
Figure 5E:
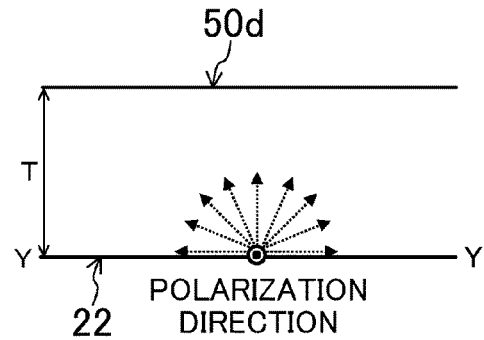

FIGS. 5A-5E show the configuration of a striped structure 50 used for simulative calculation which evaluates the light distribution characteristics. FIG. 5A is a plan configuration of the striped structure 50. FIG. 5B shows a cross-sectional configuration of the striped structure 50 in the X-X direction when the angle θ is 0°. FIG. 5C shows a cross-sectional configuration of the striped structure 50 in the Y-Y direction when the angle θ is 0°. FIG. 5D shows a cross-sectional configuration of the striped structure 50 in the X-X direction when the angle θ is 90°. FIG. 5E shows a cross-sectional configuration of the striped structure 50 in the Y-Y direction when the angle θ is 90°. The dashed arrows in the figures show how light from an emission point is emitted.

Here, in order to simply illustrate the striped structure 50 including recesses and projections, it is provided that each recess 50b has a square cross-sectional shape having a depth of L1 and a width of L1. It is also provided that L2 represents the width of a top surface of each projection 50a, and T represents the distance from the top surfaces 50d of the projections 50a to the active layer 22. Here, the striped structure 50 can be expressed using three parameters, i.e., θ, A, and B, where A represents the ratio of L1 to T (A=L1/T), and B represents the ratio of L2 to L1 (B=L2/L1). A situation where the value A is small corresponds to a situation where the recesses 50b each of which is smaller than the size of the semiconductor light-emitting device are formed. The value A is less than 1. A situation where the value B is small corresponds to a situation where the area of each top surface 50d is small. A situation where the value B is 0 corresponds to a situation where the projections 50a have no top surface 50d. A situation where the value B is small corresponds also to a situation where the recesses 50b are formed at high density.

Figure 6:
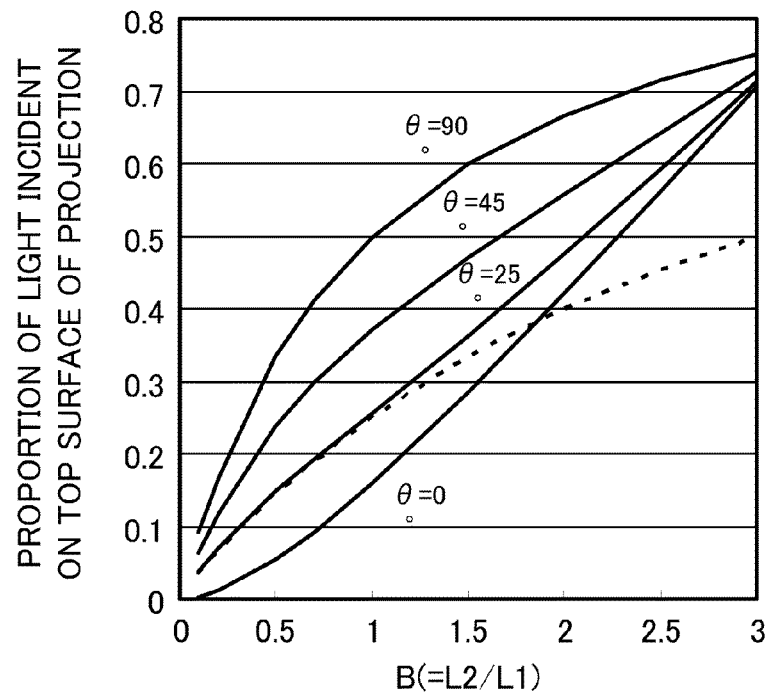
FIG. 6 is a graph illustrating the relationship between the ratio of the width of each projection to the width of each recess of the striped structure provided to the semiconductor light-emitting device according to the first embodiment and the proportion of light incident on a top surface of the projection.

As illustrated in FIG. 5B, in the X-X direction when the angle θ=0°, light emitted from the active layer 22 spreads from an emission point to have the shape of a sector. In this case, light enters the top surface 50d of the projections 50a located over the emission point on which attention has been focused. However, light directed to the other top surfaces 50d is blocked by the recesses 50b. In contrast, as illustrated in FIG. 5D, in the X-X direction when the angle θ=90°, light emitted from the active layer 22 perpendicularly enter the striped structure 50. FIG. 6 shows the result of calculating the relationship between the value B and the proportion of light incident on the top surfaces 50d of the projections 50a, where the value A is fixed at 0.1, and the angle θ is varied among 0°, 25°, 45°, and 90°. The broken line illustrates the ratio of the total area of the top surfaces 50d of the projections 50a to the total area of the surfaces of the recesses 50b. That is, the broken line corresponds to the case where the influence of the recesses 50b is simply computed from the surface area. Here, the proportion of light incident on the top surfaces 50d of the projections 50a serving as a vertical axis is normalized using 1 as a maximum value. A value obtained by subtracting the proportion from 1 denotes the proportion of light incident on the surfaces of the recesses 50b. In a wide B range from 0.1 to 3.0, in which the calculation was performed, it can be seen that when the angle θ is increased, the proportion of light incident on the top surfaces 50d of the projections can be increased. In other words, when the striped structure 50 is formed at a light output surface of the nitride semiconductor light-emitting device including the active layer 22 having polarization characteristics, reducing the angle θ, that is, setting the angle θ to be not less than 0° and not more than 45° allows a large portion of light to be incident on the surfaces of the recesses 50b. In the range in which the value B is not more than 1.7, the proportion of light when θ=0° is sufficiently smaller than the value indicated by the broken line. That is, when the active layer 22 has such polarization characteristics, the influence of the surfaces of the recesses 50b cannot be estimated simply from the surface area, and the angle θ needs to be considered. In particular, when the angle θ is in the range from 0° to 25°, it is possible to sufficiently control light incident on the top surfaces of the projections 50a, and the feature that cannot be estimated simply from the surface area is exhibited.

Figure 7:
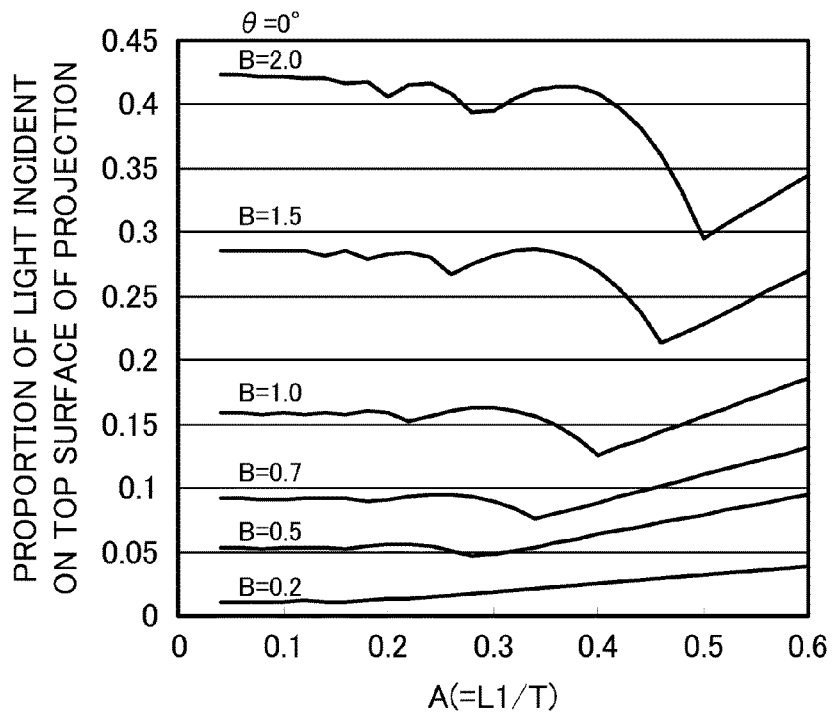
FIG. 7 is a graph illustrating the relationship between the ratio of the width of each recess to the distance from the top surface of each projection of the striped structure provided to the semiconductor light-emitting device according to the first embodiment to an active layer and the proportion of light incident on the top surface of the projection.

FIG. 7 illustrates the result of calculating the relationship between the value A and the proportion of light incident on the top surfaces 50d of the projections 50a, where the angle θ is fixed at 0°, and the value B is varied among 0.2, 0.5, 0.7, 1.0, 1.5, and 2.0. The value A represents a parameter indicating the size of each recess 50b, and when A=0.5, this means that the recesses 50b each have a size corresponding to ½ of the thickness of the substrate, and when A=0.1, this means that the recesses 50b each have a size corresponding to 10% of the thickness of the substrate.

As illustrated in FIG. 7, the proportion of light incident on the top surfaces 50d of the projections 50a weakly depends on the value A, and is relatively stabilized until the value A reaches about 0.4. When the value B is greater than 1.0, the proportion is a local minimum value within the value A range from 0.4 to 0.5. Therefore, when the value B is large, the proportion of light incident on the top surfaces 50d of the projections 50a can be controlled to a certain extent by appropriately setting the value A.

An incident angle θi represents an angle formed, when light is incident on a plane, between the direction of the normal line to the plane and the incident direction of the light. In this case, as a feature, light is less influenced by recesses/projections on the incident surface when the incident angle θi is increased. This is referred to as the Rayleigh criterion. Incident light is hardly influenced by recesses/projections on a plane under the condition that $$h < \lambda/8 \cos(\theta i)$$

where λ is the emission wavelength of the incident light, and h is the standard deviation of the recesses/projections at the surface of the plane. If h is substantially equal to L1, the relationship $$L1 \geq \lambda/0.628$$

has to be satisfied in order for 95% of light incident on the striped structure 50 to be influenced by the recesses 50b and the projections 50a. When the wavelength is 450 nm, the depth L1 of each recess 50b has to be not less than 717 nm.

In order for 99% of light incident on the striped structure 50 to be influenced by the recesses 50b and the projections 50a, the relationship $$L1 \geq \lambda/0.126$$

has to be satisfied. When the wavelength is 450 nm, the depth L1 of each recess 50b has to be not less than 3581 nm.

However, the value L1 cannot be greater than or equal to the thickness of the substrate in practice. When the value L1 is about ½ or less of the thickness of the substrate, the rigidity of the substrate can be maintained even after the formation of the striped structure 50, and thus no handling problem arises. When the value L1 is about ⅓ or less of the thickness of the substrate, it is possible to avoid a problem where the light-emitting device is divided in a region other than a desired part of the light-emitting device when the light-emitting device is singulated.

Based on the above results, in regards to the projections 50a and the recesses 50b of the striped structure 50, the angle θ formed between the extension direction of the striped structure 50 and the polarization direction of light from the active layer 22 may be not less than 0° and not more than 45° in order to increase the influence of the recesses 50b. The angle θ may be in the range from 0° to 25°.

The ratio B (B=L2/L1) between the width L2 of the top surface 50d of each projection 50a and the width L1 of the recess 50b may be not more than 1.7. The value L1 may be not less than 717 nm. The value L1 may be not less than 3581 nm. The value L1 may be about ½ or less of the thickness of the substrate. The value L1 may be about ⅖ or about ⅓ of the thickness of the substrate.

Next, the minute uneven structures (textures) 51 formed at the surfaces of the recesses 50b will be described in detail.

As described above, since providing the recesses 50b is dominant in improving the efficiency of light extraction, the state of the surfaces of the recesses 50b significantly influences the characteristics of light output to the outside.

Figure 8A:
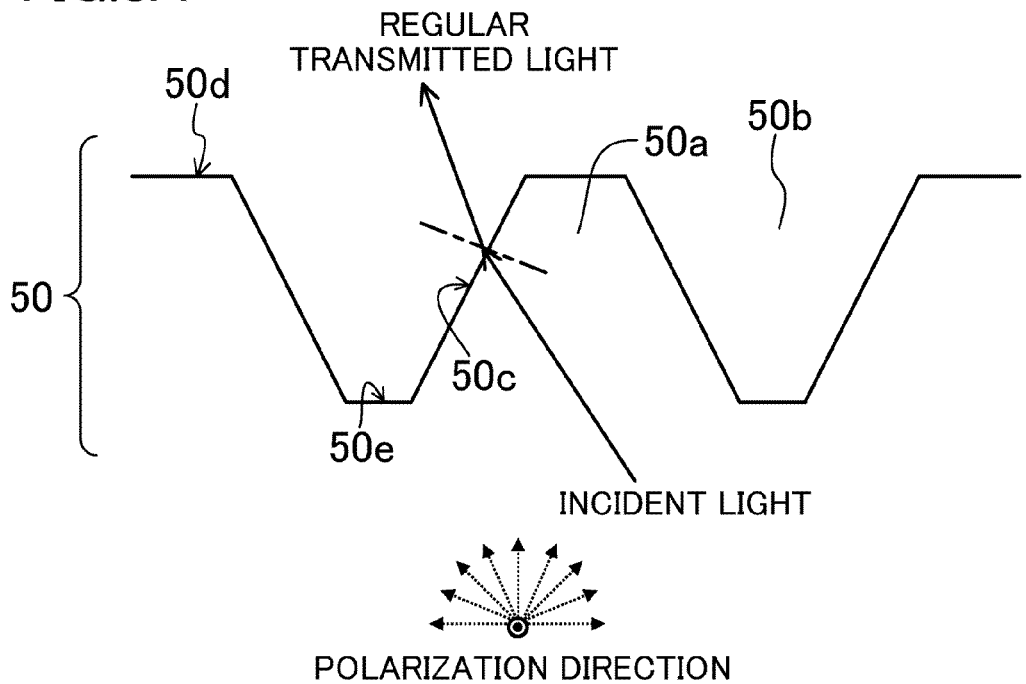
FIG. 8A is a cross-sectional view schematically illustrating an example optical path of light incident on a surface of a conventional recess of a stripe pattern on a light output surface of a semiconductor light-emitting device, where for comparison, no minute uneven structure is provided to the recess.
Figure 8B:
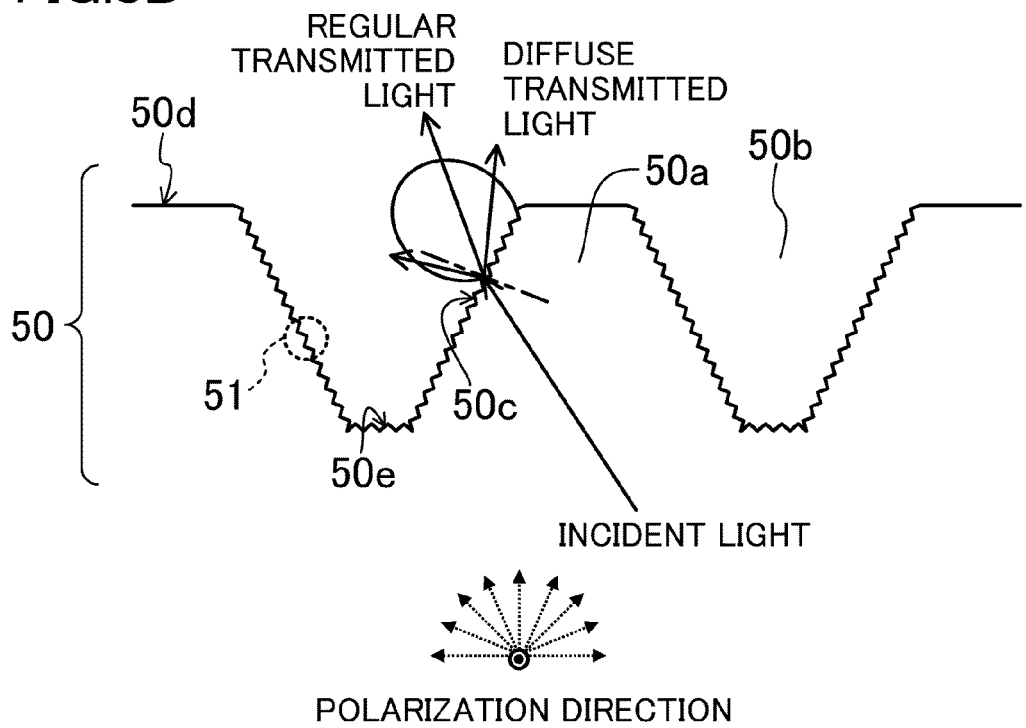
FIG. 8B is a cross-sectional view schematically illustrating an example optical path of light incident on a surface of the recess of the striped structure of the semiconductor light-emitting device according to the first embodiment.

FIG. 8A illustrates an optical path of light incident on a surface of one of recesses 50b of a conventional configuration, where for comparison, no minute uneven structure 51 is provided at the surface of the recess 50b. FIG. 8B illustrates an optical path of light incident on a surface of one of the recesses 50b of the present embodiment including the minute uneven structures 51 provided at the surfaces of the recesses 50b.

As illustrated in FIG. 8A, in the conventional configuration in which no minute uneven structure 51 is provided, most part of the transmitted light is regular transmitted light. That is, transmitted light is output in a direction determined by the refractive index of the projection 50a, the refractive index of a material in the recess 50b, and the incident angle of the incident light. In a periodic structure in which a structure including a projection 50a and a recess 50b is repeatedly formed, light may be intensified in a certain direction, and the luminance intensity distribution exhibits the characteristics of including an amplitude and being distorted.

In contrast, as illustrated in FIG. 8B, in the present embodiment including the minute uneven structure 51 provided at the surfaces (inner surfaces) of the recesses, since transmitted light includes components of regular transmitted light and components of diffuse transmitted light, light diffused in various directions is extracted to the outside. As a result, the luminous intensity distribution can be approximated to a nondirectional, so-called Lambertian shape. The total reflection component at the surfaces of the recesses 50b can also be reduced. Thus, the efficiency of light extraction is improved, so that output power can be increased. In order to verify the advantages, calculation using a ray-tracing method was performed.

Figure 9A:
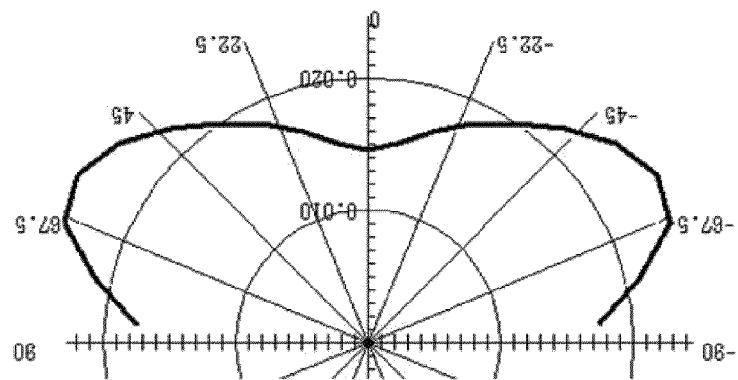
FIG. 9A is a graph illustrating the result of calculation of distribution of the light distribution characteristic of a semiconductor light-emitting device, where for comparison, no striped structure is provided at a light output surface of the semiconductor light-emitting electrode.
Figure 9B:
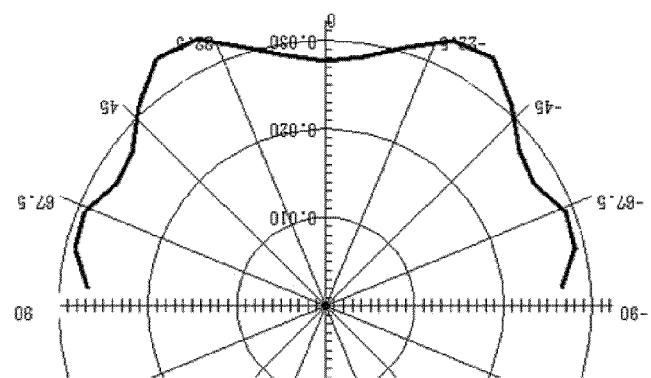
FIG. 9B is a graph illustrating the result of calculation of distribution of the light distribution characteristic of a semiconductor light-emitting device, where for comparison, no minute uneven structure is provided to each of recesses of a striped structure of the semiconductor light-emitting device.
Figure 9C:
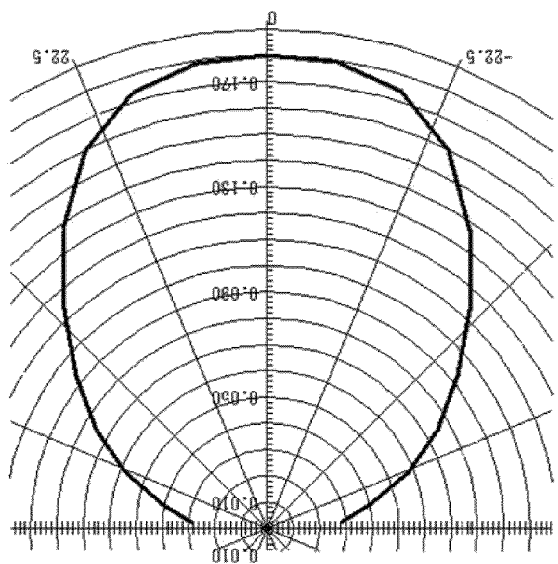
FIG. 9C is a graph illustrating the result of calculation of distribution of the light distribution characteristic of the semiconductor light-emitting device according to the first embodiment.

FIGS. 9A-9C illustrate the result of calculation of the luminous intensity distribution. FIG. 9A illustrates, for comparison, the result of calculation of the luminous intensity distribution using the ray-tracing method performed on a light-emitting device having a light extraction surface which is a specular surface. Here, the chip size of the light-emitting device is 450 μm square, and the thickness of the substrate 10 is 100 μm. As illustrated in FIG. 9A, due to the influence of light output from a side surface of the chip, the luminous intensity distribution is expressed in a radial shape having peaks near positions of ±70° from the direction of the principal plane of the chip.

FIG. 9B illustrates, for comparison, the result of calculation of the luminous intensity distribution using the ray-tracing method performed on a light-emitting device in which surfaces (inner surfaces) of stripe-like recesses 50b are specular surfaces. Here, the width of a top surface of each of projections 50a is substantially 0 μm, the width of each recess 50b is 20 μm, and the depth of each recess 50b is 25 μm. The chip size of the light-emitting device is 450 μm square, and the thickness of a substrate 10 is 100 μm. In this case, as illustrated in FIG. 9B, due to the influence by a striped structure 50 having an uneven cross-sectional shape, the luminous intensity distribution is expressed in a radial shape having a plurality of peaks.

FIG. 9C illustrates the result of calculation of the luminous intensity distribution using the ray-tracing method performed on the light-emitting device corresponding to the present embodiment. Here, the width of the top surface of each projection 50a is substantially 0 μm, the width of each recess 50b is 20 μm, and the depth of each recess 50b is 25 μm. The calculation was performed with an ideal Lambert diffusion surface being defined only at the surfaces (inner surfaces) of the recesses 50b, and the top surfaces of the projections 50a being defined as a specular surfaces. The chip size of the light-emitting device is 450 μm square, and the thickness of the substrate 10 is 100 μm. In this case, FIG. 9C shows that due to diffusion caused by the surfaces of the recesses 50b, the radial shape approximates the Lambert shape. As described above, it can be seen that when diffusion surfaces (textures) are provided at the surfaces, i.e., inner surfaces, of the recesses 50b, the radial shape of the luminous intensity distribution can be approximated to the Lambert shape.

Figure 10:
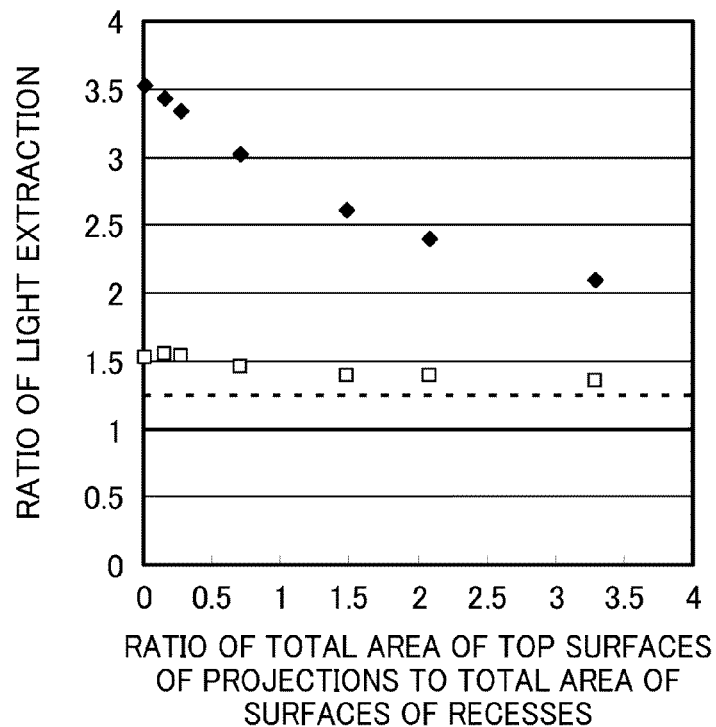
FIG. 10 is a graph illustrating the relationship between the ratio of the total area of the top surfaces of the projections to the total area of the surfaces of the recesses of the striped structure and the light extraction ratio of the semiconductor light-emitting device according to the first embodiment.

FIG. 10 illustrates the result of evaluation by calculation of light extraction in the semiconductor light-emitting device according to the present embodiment. The vertical axis shows values obtained by normalization using a value obtained in the case of the light extraction surface being a specular surface as 1. The broken line in the figure represents the result of calculation in the case where in a comparative configuration including no striped structure 50 including projections 50a and recesses 50b, a Lambert diffusion surface is defined on the light extraction surface. The comparative ratio of light extraction was 1.25.

White squares (□) in the figure represent the results of calculation when the striped structure 50 is provided at the light extraction surface, where the surfaces of the recesses 50b are specular surfaces. The horizontal axis represents the ratio of the total area of the top surfaces of the projections 50a to the total area of the surfaces of the recesses 50b. Each recess 50b has a V-shaped cross-sectional shape whose width and depth are both 20 μm. The ratio of light extraction in this case was about 1.5.

Black diamonds (♦) in the figure represent the results of calculation when each of recesses 50b has a V-shaped cross-sectional shape whose width and depth are both 20 μm, and a Lambert diffusion surface is defined at a surface of each of recesses 50b. That is, this configuration corresponds to the configuration of the present embodiment. In this case, the ratio of light extraction was not less than 2.0. The ratio of light extraction which can be estimated from the white squares and the broken line (product of the result represented by the white squares and the result represented by the broken line) was about 1.9. Thus, it can be seen that the ratio of light extraction according to the present embodiment is greater than the ratio of light extraction which can be estimated from the white squares and the broken line. The smaller the ratio of the total area of the top surfaces 50d of the projections 50a to the total area of the surfaces of the recesses 50b is, the higher the ratio of light extraction is.

The present embodiment shows that uneasily predictable improvement of the efficiency of light extraction can be achieved by a multiplier effect of the striped structure 50 including the projections 50a and the recesses 50b and the minute uneven structures (textures) 51 formed at the surfaces of the recesses 50b.

The surface roughness Ra of the minute uneven structure 51 may be not less than $\lambda/30$ and not more than $\lambda \times 5$. The surface roughness Ra may be not less than $\lambda/30$ and not more than $\lambda \times 3$. The surface roughness Ra may be not less than $\lambda/4$ and not more than $\lambda \times 3$. Here, $\lambda$ is the wavelength of light output from the active layer 22. When the surface roughness Ra is in the range from $\lambda/30$ to $\lambda \times 3$, light transmitted through the surfaces of the recesses 50b is influenced by the effect of scattering called Rayleigh scattering or Mie scattering. When the surface roughness is not less than $\lambda/2$, diffuse components increase.

Specifically, when the wavelength of polarized light generated in the active layer 22 is 450 nm, the surface roughness Ra may be not less than 15 nm and not more than 2.25 μm. The surface roughness Ra may be not less than 15 nm and not more than 1.35 μm. The surface roughness Ra may be not less than 113 nm and not more than 1.35 μm. However, the surface roughness Ra has to be less than the value L1.

Here, the surface roughness Ra can be measured by, for example, a laser microscope (VK-X200 manufactured by Keyence). When a measurement surface is viewed in cross section, the surface roughness Ra can be obtained by using the arithmetic average roughness defined in "Japanese Industrial Standard (JIS) B0601." The cross-sectional curve of the measurement surface is measured according to "JIS B0601," and from the cross-sectional curve, a waviness curve is obtained. Then, the waviness curve is subtracted from the cross-sectional curve. That is, a roughness curve can be obtained by extracting only the roughness from the cross-sectional curve. According to the coordinate systems defined by "JIS B0601," a direction along the measurement surface is the X axis, and a direction along a measurement cross section is the Z axis.

Waviness means periodical unevenness of a surface, the interval of the unevenness being greater than the roughness. In the present disclosure, the recesses 50b correspond to the waviness. Here, in order to simplify the description, a direction in which the recesses 50b extend is defined as the measurement cross section.

When the measurement cross section is defined as described above, the waviness due to large recesses/projections of the striped structure 50 does not need to be considered. As a result, the waviness curve is a straight line, which reduces measurement errors, so that a correct surface roughness Ra can be obtained. When only a reference length 1 is extracted along the X axis, and the least-squares method is applied to the extracted length, the following expression (1) can be obtained.

$$f(x) = \sum_{k=0}^{1} a_k x^k \quad \text{Expression (1)}$$

Here, $a_k$ satisfies the following expression (2).

$$\int_0^h \{Z(x)\}^2 dx \geq \int_0^h \{Z(x)-(cx+b)\}^2 dx \quad \text{Expression (2)}$$

where c and b are given values.

Here, the arithmetic average roughness Ra is a value obtained by averaging the absolute value of the deviation between $Z(x)$ and $f(x)$, and can be obtained by the following expression (3).

$$Ra = \frac{1}{l}\int_0^h |Z(x)-f(x)|dx \quad \text{Expression (3)}$$

Specifically, by using a microscope such as a laser microscope allowing high-powered observation, the measurement surface is observed along its cross section as described above, and the waviness curve and the roughness curve are obtained from the cross-sectional curve. When such a length that satisfies the reference length 1 defined by "JIS B0601" cannot be obtained, the reference length 1 as long as possible is selected, so that the arithmetic average roughness Ra can be measured with a high accuracy. In a selected region, 100 values X ($X_1$-$X_{100}$) are taken at a regular interval, and values Z at the values X (($Z(X_1)$-$Z(X_{100})$)) are measured. From the measured values Z, $f(x)$ can be obtained by the least-squares method. Using the obtained $f(x)$, the surface roughness Ra can be obtained by the following expression (4).

$$Ra = \frac{1}{100} \times \{|Z(X_1) - f(X_1)| + \quad \text{Expression (4)}$$
$$|Z(X_2) - f(X_2)| + \ldots + |Z(X_{100}) - f(X_{100})|\}$$

(Fabrication Method)

A method for fabricating the semiconductor light-emitting device according to the first embodiment will be described below with reference to FIGS. 3A-3D.

First, as illustrated in FIG. 3B, an n-type nitride semiconductor layer 21 is, for example, epitaxially grown on the principal plane of a substrate 10 having an m-plane as its principal plane and made of n-type GaN by metal organic chemical vapor deposition (MOCVD) or any other method. Here, when a semipolar plane or a nonpolar plane is selected as the principal plane of the substrate 10, it is possible to form an active layer having polarization characteristics. For the growth of the n-type nitride semiconductor layer 21, for example, silicon (Si) is used as an n-type dopant, trimethylgallium (TMG: Ga(CH$_3$)$_3$) being a gallium source and ammonia (NH$_3$) being a nitrogen source are supplied to the substrate 10, and the growth temperature is about 900-1100° C. In this way, the n-type nitride semiconductor layer 21 having a thickness of about 1-3 μm and made of GaN is formed. The substrate 10 is a substrate at the wafer level, and a plurality of light-emitting structures forming semiconductor light-emitting devices can be fabricated at once.

Next, an active layer 22 made of a nitride semiconductor is grown on the n-type nitride semiconductor layer 21. The active layer 22 has an InGaN/GaN multiple quantum well (MQW) structure in which, for example, 15-nm-thick well layers made of In$_{1-x}$Ga$_x$N and 10-nm-thick barrier layers made of GaN are alternately stacked. When the well layers made of In$_{1-x}$Ga$_x$N are formed, the growth temperature may be decreased to a temperature of about 700-800° C. to ensure incorporation of In into the well layers being grown. The emission wavelength is selected based on the intended use of the semiconductor light-emitting device, and the In content x is determined based on the wavelength. For example, when the wavelength is 450 nm (blue light wavelength), the In content x is determined to be about 0.25-0.27. When the wavelength is 520 nm (green light wavelength), the In content x is determined to be about 0.40-0.42. When the wavelength is 630 nm (red light wavelength), the In content x is determined to be about 0.56-0.58.

Next, a p-type nitride semiconductor layer 23 is epitaxially grown on the active layer 22. For the growth of the p-type nitride semiconductor layer 23, for example, bis cyclopentadienyl magnesium (Cp$_2$Mg) is used as p-type impurities, TMG and NH$_3$ are supplied, as materials, to the substrate 10, and the growth temperature is about 900-1100° C. In this way, the p-type nitride semiconductor layer 23 having a thickness of about 50-500 nm and made of p-type GaN is formed on the active layer 22. The p-type nitride semiconductor layer 23 may contain an about 15-30-nm-thick p-type AlGaN layer. The formation of the p-type AlGaN layer can reduce the overflow of electrons that are carriers. An undoped GaN layer may be formed between the active layer 22 and the p-type nitride semiconductor layer 23.

Next, in order to activate Mg with which the p-type nitride semiconductor layer 23 is doped, the p-type nitride semiconductor layer 23 is thermally treated at a temperature of about 800-900° C. for about 20 minutes. In this way, a semiconductor stacked structure 20 is formed by sequential epitaxial growth on the principal plane of the substrate 10.

Next, the semiconductor stacked structure 20 including the n-type nitride semiconductor layer 21, the active layer 22, and the p-type nitride semiconductor layer 23 is partially etched by lithography and dry etching using a chlorine (Cl$_2$) based gas. Thus, a recess 31 is formed by removing a portion of the p-type nitride semiconductor layer 23, a portion of the active layer 22, and a portion of the n-type nitride semiconductor layer 21 to expose a region of the n-type nitride semiconductor layer 21.

Next, an n-side electrode 30 is selectively formed on and in contact with the region of the n-type nitride semiconductor layer 21 exposed from the recess 31. Here, for example, a multilayer film (Ti/Pt layer) of titanium (Ti) and platinum (Pt) is formed as the n-side electrode 30.

Next, a p-side electrode 40 is selectively formed on and in contact with the p-type nitride semiconductor layer 23. For example, a multilayer film (Pd/Pt layer) of, for example, palladium (Pd) and platinum (Pt) is formed as the p-side electrode 40. Thereafter, thermal treatment is performed to alloy an interface region between the Ti/Pt layer and the n-type nitride semiconductor layer 21 and an interface region between the Pd/Pt layer and the p-type nitride semiconductor layer 23. The order in which the n-side electrode 30 and the p-side electrode 40 are formed is not particularly limited.

Next, a (back) surface of the substrate 10 opposite to the n-type nitride semiconductor layer 21 is polished to reduce the thickness of the substrate 10. Here, the thickness of the substrate 10 is reduced to about 50-150 μm.

Next, a striped structure 50 is formed. In order to form the striped structure 50, a resist is patterned using, for example, a contact exposure system, an electron beam lithography system, or a stepper to have a striped pattern. Thereafter, a recess 50b may be formed in each of openings of the resist pattern by dry etching. In order to form a minute uneven structure (texture) 51, minute resist patterning is performed by, for example, nanoimprinting, or an electron beam lithography system. Thereafter, the minute uneven structure 51 may be formed at a surface (inner surface) of each recess 50b by dry etching.

In order to form the striped structure 50, for example, grinding using a dicing blade, or a thermal melting method using a high-density pulsed laser beam can be used. In such a method, it is possible to simultaneously form the striped structure 50 having projections 50a and recesses 50b and the minute uneven structure 51 at the surface of each recess 50b. A resist patterning step is no longer required, which also provides the advantage of simplifying the fabrication process.

For example, in the grinding using a dicing blade, recesses each having a square cross-sectional shape can be formed by using a straight blade. When a blade having a tapered side surface is used, recesses each having a V-shaped or trapezoidal cross-sectional shape can be formed. The width of each recess 50b depends on the thickness of the used blade. The depth of each recess 50b depends on a grinding surface and a position at which the blade is set. The width of each projection 50a depends on the moving amount of the dicing blade. The linear cross-section roughness Ra of the minute uneven structure 51 in a direction in which the striped structure 50 extends can be controlled by the roughness of the grinding surface of the blade. When the grinding is performed by using such a dicing blade, it is possible to form the minute uneven structure 51 of not less than about 100 nm and not more than about 1 μm on a grinded surface.

In the thermal melting method using a high-density pulsed laser beam, the recess 50b is formed in a region scanned by the laser beam. Since the intensity of the laser beam is modulated by a pulse, the minute uneven structure 51 associated with the intensity modulation of the laser beam is formed at the surface of the recess 50b simultaneously with the formation of the recess 50b. The cross-sectional shape of the recess 50b and the surface roughness Ra of the minute uneven structure 51 can be controlled by the focal position and the scanning speed of the laser beam.

For example, in order to increase the linear cross-section roughness Ra of the minute uneven structure 51 in a direction in which the striped structure 50 extends, the scanning speed of the laser beam may be lowered, or the focal position of the laser beam may be moved away from the substrate 10. In contrast, in order to reduce the linear cross-section roughness Ra, the scanning speed of the laser beam may be increased, or the focal position of the laser beam may be brought close to the substrate 10.

In order to reduce the angle formed between the direction of the normal line to the principal plane of the substrate 10 and the inclined surface 50c of the recess 50b, the scanning speed of the laser beam may be increased, or the focal position of the laser beam may be moved away from the substrate 10. In contrast, in order to increase the angle formed between the direction of the normal line to the principal plane of the substrate 10 and the inclined surface 50c of the recess 50b, the scanning speed of the laser beam may be lowered, or the focal position of the laser beam may be brought close to the substrate 10.

Specifically, the scanning speed of the laser beam may be, for example, 50-300 mm/s. In this case, the angle formed between the direction of the normal line to the principal plane of the substrate 10 and the inclined surface 50c of the recess 50b can be controlled in the range from 15° to 75°. When the scanning speed of the laser beam is, for example, in the range from 50 mm/s to 300 mm/s, the linear cross-section roughness Ra of the minute uneven structure 51 in a direction in which the striped structure 50 extends can be controlled in the range from 20 nm to 1 μm. When the striped structure 50 is formed by the thermal melting method using a high-density pulsed laser beam, a residue deposited by thermal melting is preferably removed by wet etching. For example, hydrochloric acid (HCl), nitric acid ($HNO_3$), or potassium hydroxide (KOH) can be used as a solution for use in wet etching.

Next, separation grooves are formed in the wafer-level semiconductor light-emitting device 101 using a laser melting apparatus. Then, the wafer-level semiconductor light-emitting device 101 is divided into small pieces (chips) using a breaking apparatus. Thus, as illustrated in FIGS. 3A-3C, the semiconductor light-emitting device 101 provided with the striped structure 50 and the minute uneven structure 51 at the surface of each recess 50b can be obtained.

Instead of the nitride semiconductor layer grown on the substrate 10 having an m-plane as a principal plane and made of n-type GaN, an m-plane nitride semiconductor layer grown on, for example, a SiC substrate, a sapphire substrate, a $LiAlO_2$ substrate, a $Ga_2O_3$ substrate, or a Si substrate may be used in the semiconductor stacked structure 20. In this case, the striped structure 50 is formed in an upper portion of a hetero-substrate such as a SiC substrate before the nitride semiconductor layer is epitaxially grown. Then, the nitride semiconductor layer is epitaxially grown, and further, the hetero-substrate is removed by laser lift-off processing, so that the striped structure 50 of the hetero-substrate formed before the epitaxial growth of the nitride semiconductor layer is transferred to the semiconductor stacked structure 20 serving as a nitride semiconductor. Therefore, after the hetero-substrate is removed, the semiconductor light-emitting device 101 provided with the striped structure 50 can be obtained. The semiconductor light-emitting device 101 can be fabricated by the method described above.

Here, for the epitaxial growth of the semiconductor stacked structure 20 including a nitride semiconductor having an m-plane on the substrate 10, the orientation of the principal plane of the SiC substrate or the sapphire substrate used for the substrate 10 may also be the m-plane. However, it has been reported that an a-plane GaN can be grown on a sapphire substrate having an r-plane as a principal plane. Therefore, in order to grow a nitride semiconductor layer having an m-plane as a principal plane, it is not necessary that the principal plane of the substrate 10 made of n-type GaN is the m-plane. At least the principal plane (growth surface) of the active layer 22 may be parallel to the m-plane, and the growth direction of the crystal growth thereof may be perpendicular to the m-plane.

(First Variation of First Embodiment)

Figure 11:
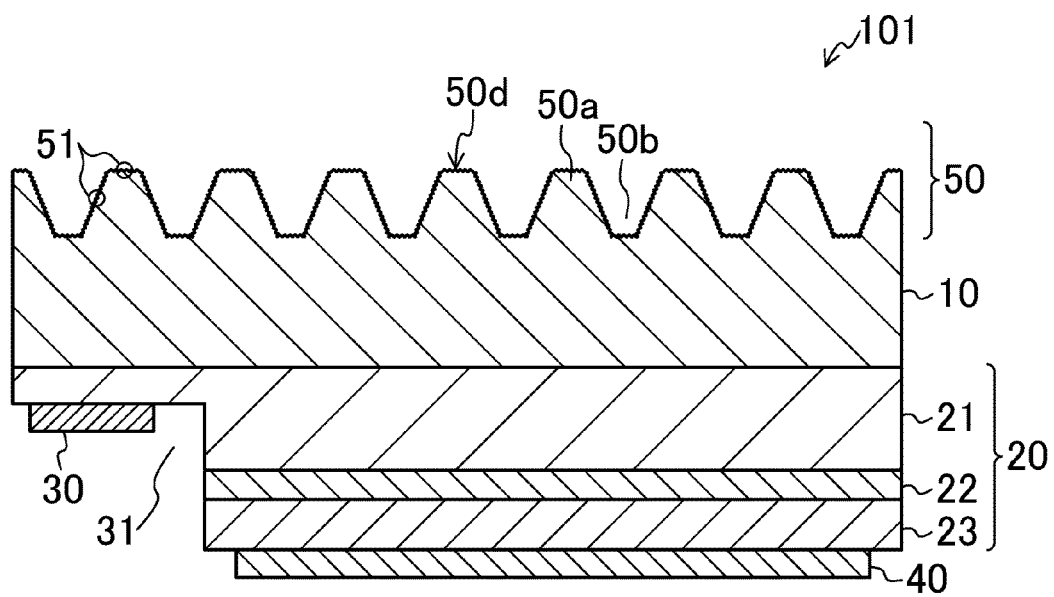
FIG. 11 is a cross-sectional view schematically illustrating a semiconductor light-emitting device according to a first variation of the first embodiment.

FIG. 11 illustrates a first variation of the first embodiment. In the following variation, structural differences and differences in the fabrication method will be described.

FIG. 11 illustrates a cross-sectional configuration of a semiconductor light-emitting device 101 according to the first variation in a direction corresponding to the X-X direction of, for example, FIG. 4A. As illustrated in FIG. 11, minute uneven structures (textures) 51 similar to those on the inner surfaces of the recesses 50b are formed also on top surfaces 50d of projections 50a of a striped structure 50 according to the present variation.

As described above, since the minute uneven structures 51 are formed also on the top surfaces 50d of the projections 50a of the striped structure 50, outgoing light can also be diffused at the top surfaces 50d of the projections 50a. Therefore, the luminous intensity distribution of outgoing light can be improved. Moreover, the efficiency of light extraction from the top surfaces 50d of the projections 50a is increased, so that the light output of the semiconductor light-emitting device 101 can be increased.

An example method for fabricating the minute uneven structures 51 on the top surfaces 50d of the projections 50a will be described.

First, minute resist patterning is performed on a second principal plane of a substrate 10 by nanoimprinting or an electron beam lithography system. Then, minute uneven structures 51 are formed at the top surfaces 50d of the projections 50a by dry etching. Subsequently, a plurality of recesses 50b and minute uneven structures 51 on surfaces of the recesses 50b are formed by grinding using a dicing blade or a thermal melting method using a high-density pulsed laser beam.

(Second Variation of First Embodiment)

Figure 12:
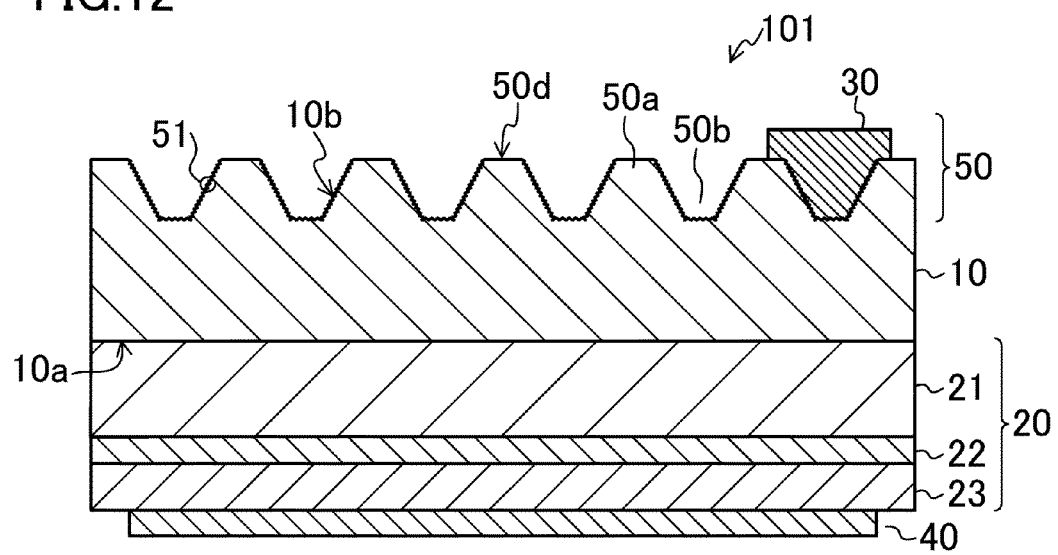
FIG. 12 is a cross-sectional view schematically illustrating a semiconductor light-emitting device according to a second variation of the first embodiment.

FIG. 12 illustrates a second variation of the first embodiment. In the following variation, structural differences and differences in the fabrication method will be described.

FIG. 12 illustrates a cross-sectional configuration of a semiconductor light-emitting device 101 according to the second variation in a direction corresponding to the X-X direction of, for example, FIG. 4A. As illustrated in FIG. 12, the semiconductor light-emitting device 101 according to the present variation includes an n-side electrode 30 formed on an output surface (back surface) of a substrate 10 provided with a striped structure 50. That is, the n-side electrode 30 is not directly formed on an n-type nitride semiconductor layer 21 of a semiconductor stacked structure 20 of the semiconductor light-emitting device 101. Thus, a recess 31 from which the n-type nitride semiconductor layer 21 is exposed is not formed in the semiconductor stacked structure 20.

In the present variation, the substrate 10 has to have conductivity. Therefore, a semiconductor substrate made of, for example, gallium nitride (GaN), silicon carbide (SiC), or zinc oxide (ZnO) can be used as the substrate 10. The n-side electrode 30 is made of, for example, a layered structure (Ti/Pt) of a Ti layer and a Pt layer, and provided to cover part of the striped structure 50. A metal layered structure containing aluminum (Al) as a main component may be used as the n-side electrode 30.

In the semiconductor light-emitting device 101 according to the present variation, it is not necessary to form the recess 31 in the semiconductor stacked structure 20. This simplifies the structure of the semiconductor light-emitting device 101, so that fabrication costs can be reduced.

The semiconductor light-emitting device 101 according to the present variation can be fabricated by, for example, the following method.

First, a semiconductor stacked structure 20 is epitaxially grown on a first principal plane 10a of a substrate 10. Then, a second principal plane 10b which is a back surface of the substrate 10 is polished so that the total thickness of the semiconductor stacked structure 20 and the substrate 10 is reduced to about 100 μm.

Next, a striped structure 50 including projections 50a and recesses 50b is formed at the second principal plane 10b of the substrate 10 by the previously described method. Thereafter, minute uneven structures 51 are formed at surfaces of the recesses 50b. Here, the recesses 50b and the minute uneven structures 51 at the surfaces of the recesses 50b may be simultaneously formed by, for example, grinding by blade dicing or a thermal melting method using a high-density pulsed laser beam. Then, an n-side electrode 30 which is a multilayer film made of Ti/Pt is selectively formed on the second principal plane 10b of the substrate provided with the striped structure 50. On the other hand, a p-side electrode 40 which is a multilayer film made of Pd/Pt is formed on a p-type nitride semiconductor layer 23 of the semiconductor stacked structure 20. Then, thermal treatment is performed to alloy an interface region between the Ti/Pt layer and the substrate 10 and an interface region between the Pd/Pt layer and a p-type contact layer of the p-type nitride semiconductor layer 23. In this way, the n-side electrode 30 and the p-side electrode 40 are electrically connected to the substrate 10 and the p-type contact layer, respectively.

The semiconductor light-emitting device 101 according to the second variation illustrated in FIG. 12 can thus be fabricated.

As described above, in the first embodiment, the striped structure 50 is formed at a light output surface of the nitride semiconductor light-emitting device having an active layer from which polarized light is output, the angle θ formed between the polarization direction of light from the active layer 22 and the extension direction of the striped structure is set in the range from 0° to 45°, and the minute uneven structures (textures) 51 are further formed at the surfaces of recesses 50b, so that the luminous intensity distribution can be improved, and the light output can be improved.

Second Embodiment

A second embodiment will be described below with reference to the drawings.

Figure 13:
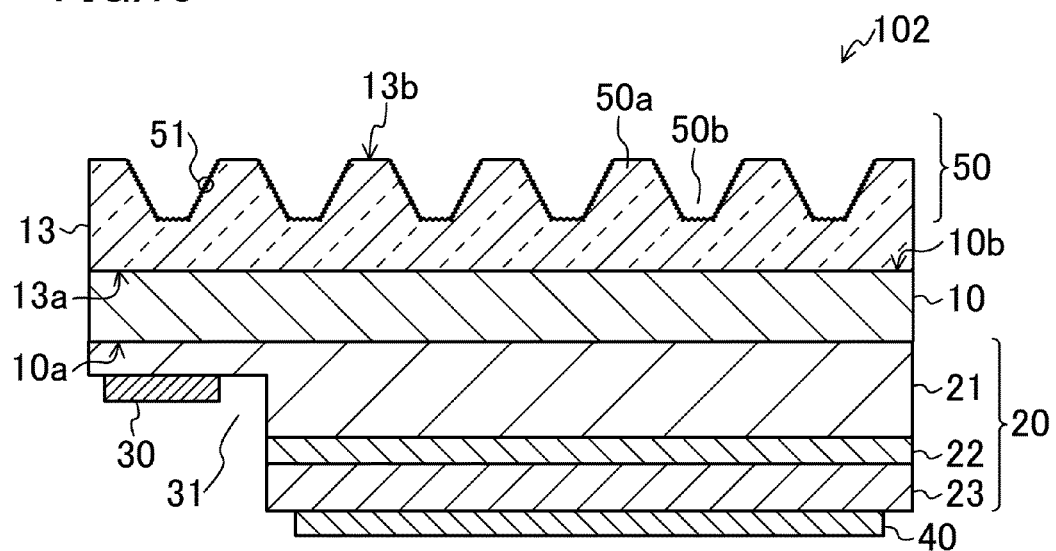
FIG. 13 is a cross-sectional view schematically illustrating a semiconductor light-emitting device according to a second embodiment.

FIG. 13 illustrates a cross-sectional configuration of a semiconductor light-emitting device according to a second embodiment in a direction corresponding to, for example, the X-X direction in FIG. 4A. In the following description, description of elements common to the first embodiment will be omitted, and structural differences and differences in the fabrication method will be described.

As illustrated in FIG. 13, a semiconductor light-emitting device 102 according to the second embodiment includes at least one light-transmissive member 13 which is in contact with a second principal plane 10b of a substrate 10 and is made of a material different from a material of the substrate 10.

In the semiconductor light-emitting device 102 according to the present embodiment, a first principal plane 13a of the light-transmissive member 13 which faces the substrate 10 is in contact with the second principal plane 10b of the substrate 10 opposite to a semiconductor stacked structure 20. A second principal plane 13b of the light-transmissive member 13 opposite to the substrate 10 is provided with a striped structure 50 including a plurality of alternately formed projections 50a and recesses 50b, wherein minute uneven structures 51 are formed at surfaces of the recesses 50b.

As in the first embodiment, the angle θ formed between the extension direction of the striped structure 50 and the polarization direction of light from an active layer 22 of the semiconductor stacked structure 20 is not less than 0° and not more than 45°.

The shape and the size of each projection 50a, the shape and the size of each recess 50b, the linear cross-section roughness Ra of the minute uneven structure 51 in the extension direction of the striped structure 50, and the extension direction of the striped structure 50 are similar to those in the first embodiment.

The interface between the substrate 10 and the light-transmissive member 13 may be flat.

According to the mechanism described in the first embodiment, when the striped structure 50 including the minute uneven structures 51 at the surfaces (inner surfaces) of the recesses 50b is provided in a position intersecting a light extraction path, and the angle θ formed between the extension direction of the striped structure 50 and the polarization direction of light from the active layer 22 is not less than 0° and not more than 45°, luminous intensity distribution can be improved, and the efficiency of light extraction can be improved.

For example, a material different from a material of a GaN semiconductor, such as silicon oxide ($SiO_2$), silicon nitride (SiN), silicon carbide (SiC), titanium oxide ($TiO_2$), zinc dioxide (ZnO), sapphire, lithium aluminum dioxide ($LiAlO_2$), or gallium oxide ($Ga_2O_3$) which transmits polarized light emitted from the active layer 22 can be used as the light-transmissive member 13. A light-transmissive material such as silicone resin, acrylic resin, or glass can also be used as the light-transmissive member 13. The light-transmissive member 13 may contain a fluorescent material which absorbs light emitted from the active layer 22 and converts the wavelength of the light.

In general, dry etching performed on a nitride-based semiconductor made of, for example, GaN has a low etching rate, and it is difficult to control the shape of a side wall of each recess 50b of the substrate 10. Thus, using a material which can be easily dry etched or wet etched as the light-transmissive member 13 facilitates the formation of the striped structure 50 and the minute uneven structure 51.

For example, when $SiO_2$ or SiN is used as the light-transmissive member 13, the minute uneven structure 51 can be formed also by wet etching using, for example, an aqueous solution containing hydrofluoric acid (HF). When a suitable light-transmissive material is selected, the refractive index n0 of the light-transmissive member 13 can satisfy the relationship nt<n0<n1, where nt is the refractive index of an external medium with which the second principal plane 13b provided with the striped structure 50 is in contact, and n1 is the refractive index of the substrate 10. As described above, when the light-transmissive member 13 is formed such that the refractive index stepwise varies from n1 to nt, light emitted from the active layer 22 can be efficiently extracted to the outside.

When the interface between the substrate 10 and the light-transmissive member 13 is flat, light emitted from the active layer 22 enters the light-transmissive member 13 with the polarization direction of the light being maintained. Since the light incident on the light-transmissive member 13 is strongly influenced by the minute uneven structures 51 formed at the surfaces of the recesses 50b, improvement of the luminous intensity distribution and light output, which has been described in the first embodiment, is possible.

(Fabrication Method)

A method for fabricating the semiconductor light-emitting device according to the second embodiment will be described below. By using a method similar to that described in the first embodiment, a semiconductor light-emitting device 102 before device isolation is fabricated. At this stage, a striped structure is not formed at a light output surface of the semiconductor light-emitting device 102.

Next, a film serving as a light-transmissive member 13 is formed on or is bonded to a second principal plane 10b of a substrate 10.

When $SiO_2$ or SiN is used as the light-transmissive member 13, the film serving as the light-transmissive member 13 is formed by plasma chemical vapor deposition. When the thickness of the film is increased, the quality of the film is reduced, so that the transmittance of light of the light-transmissive member 13 tends to be reduced. Therefore, the thickness of the light-transmissive member 13 may be not more than 10 μm. Then, as described above, a minute uneven structure 51 at a surface of each of recesses 50b is formed simultaneously with a striped structure 50 by grinding by blade dicing or a thermal melting method using a high-density pulsed laser beam. $SiO_2$ or SiN is softer than GaN or sapphire, and thus is easily ground or easily thermally melted.

When silicone resin or acrylic resin is used as the light-transmissive member 13, a molding method can be used. A die having recesses and projections for forming the striped structure 50, and a minute uneven structure at least at surfaces of the recesses is prepared. Subsequently, the semiconductor light-emitting device 102 is put in the prepared die, and then a resin material is poured into a gap between the die and the second principal plane 10b of the substrate 10, so that the striped structure 50 can be formed at the surface of the second principal plane 10b. As described above, after a flat resin layer made of silicone resin or acrylic resin is formed, the recesses 50b and the minute uneven structures 51 at the surfaces of the recesses 50b may be simultaneously formed by grinding by blade dicing or the thermal melting method using a high-density pulsed laser beam.

A light-transmissive member 13 having a striped structure 50 and a minute uneven structure 51 may be separately made of silicone resin, acrylic resin, or glass, and the light-transmissive member 13 may be bonded to the second principal plane 10b of the substrate 10.

Moreover, in the case where the semiconductor light-emitting device has a configuration in which a hetero-substrate is used as the substrate 10, and the hetero-substrate is removed from a semiconductor stacked structure 20 of the semiconductor light-emitting device 102, the light-transmissive member 13 according to the present embodiment can be used for the semiconductor stacked structure 20 from which the hetero-substrate has been removed. The striped structure 50 according to the present embodiment is provided to at least one of the semiconductor stacked structure 20 or the light-transmissive member 13.

(First Variation of Second Embodiment)

A first variation of the second embodiment will be described below with reference to FIG. 14.

Figure 14:
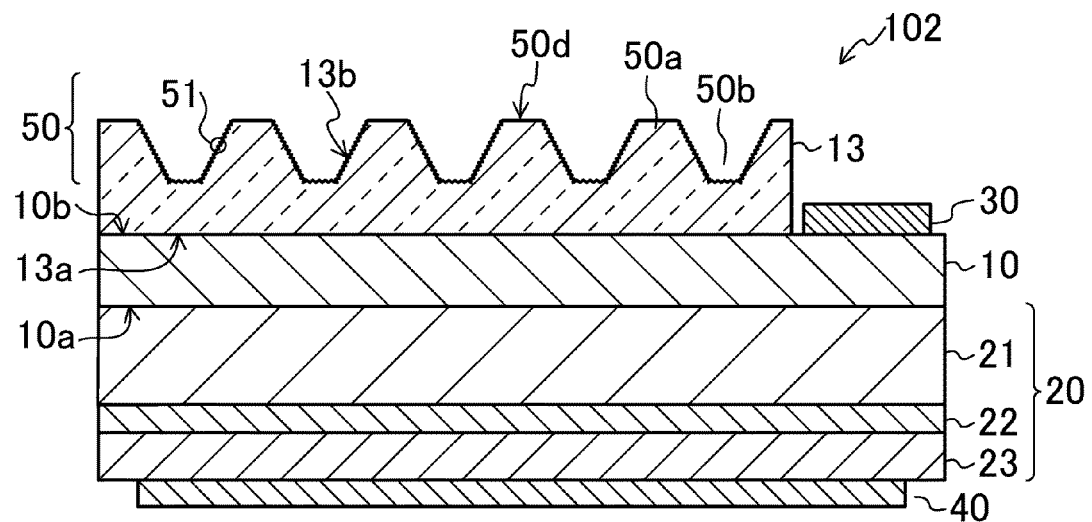
FIG. 14 is a cross-sectional view schematically illustrating a semiconductor light-emitting device according to a first variation of the second embodiment.

As illustrated in FIG. 14, in a semiconductor light-emitting device 102 according to the first variation, a region of a second principal surface 10b of a substrate 10 is exposed from a light-transmissive member 13, and an n-side electrode 30 is directly provided on the exposed region of the substrate 10.

In this case, the substrate 10 has to have conductivity. Therefore, for example, a semiconductor substrate made of GaN, SiC, or ZnO can be used as the substrate 10. Since a recess 31 does not need to be formed in a semiconductor stacked structure 20 of the semiconductor light-emitting device 102, the structure of the device is simple, so that fabrication costs can be reduced.

(Second Variation of Second Embodiment)

A second variation of the second embodiment will be described below with reference to FIG. 15.

Figure 15:
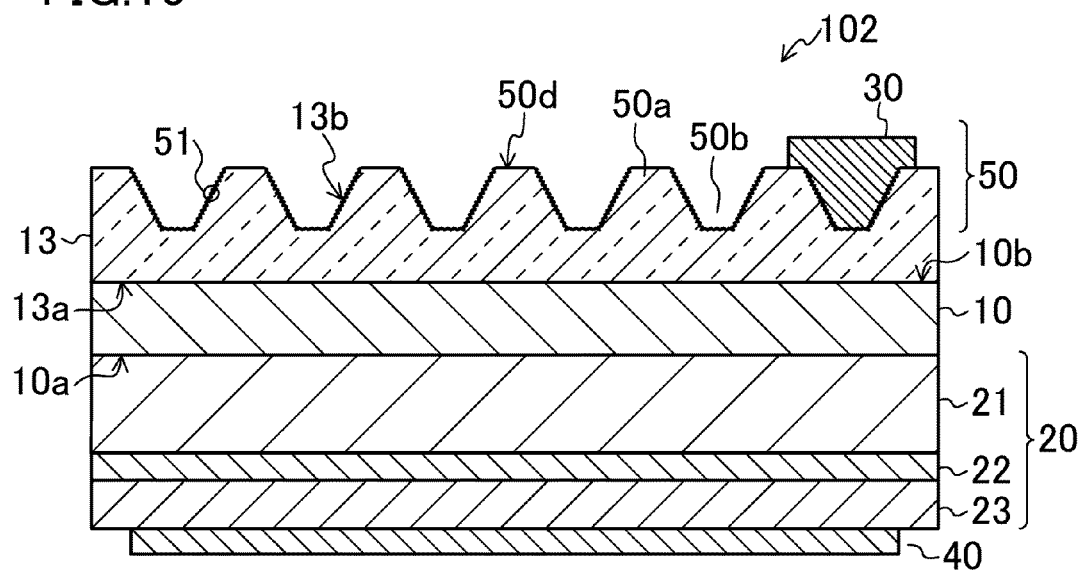
FIG. 15 is a cross-sectional view schematically illustrating a semiconductor light-emitting device according to a second variation of the second embodiment.

As illustrated in FIG. 15, a semiconductor light-emitting device 102 according to the second variation includes an n-side electrode 30 directly formed on a light-transmissive member 13 having striped structures 50 and recesses 50b.

In this case, the light-transmissive member 13 and a substrate 10 have to have conductivity. A semiconductor material such as SiC or ZnO, or a transparent electrode made of, for example, indium tin oxide (ITO) can be used as a material for the light-transmissive member 13. For example, a semiconductor substrate made of GaN, SiC, or ZnO can be used as the substrate 10.

As described above, according to the present variation, the light-transmissive member 13 has conductivity, so that a current is easily diffused in a lateral direction, and problems including concentration of a current can be avoided.

Since a recess 31 does not need to be provided in a semiconductor stacked structure 20 of the semiconductor light-emitting device 102, the structure of the device is simple, and thus fabrication costs can be reduced.

(Third Variation of Second Embodiment)

A third variation of the second embodiment will be described below with reference to FIG. 16.

Figure 16:
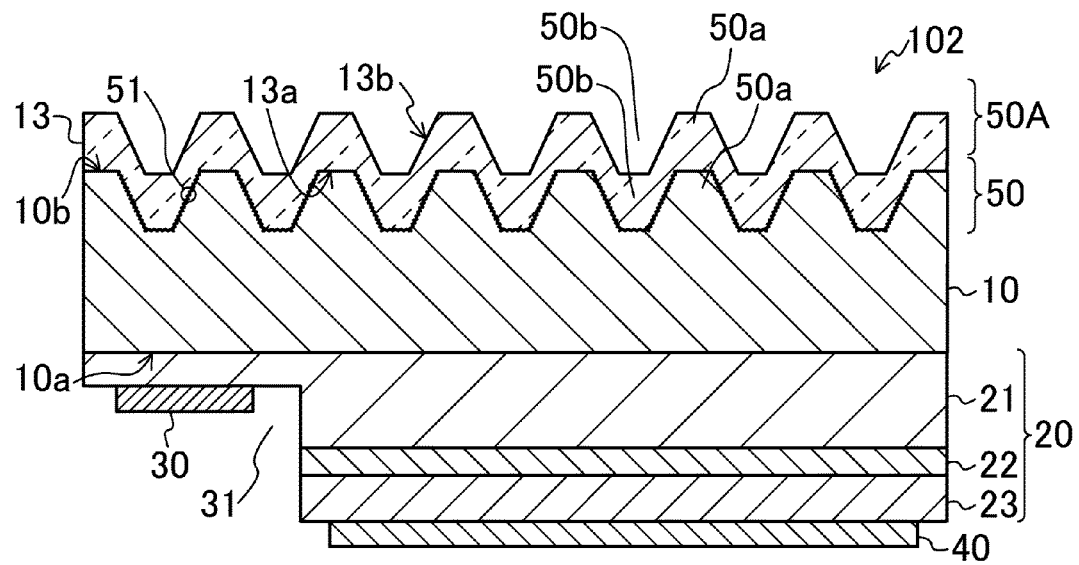
FIG. 16 is a cross-sectional view schematically illustrating a semiconductor light-emitting device according to a third variation of the second embodiment.

As illustrated in FIG. 16, a semiconductor light-emitting device 102 according to the third variation includes a light-transmissive member 13 formed on a second principal plane 10b of a substrate 10 having striped structures 50 and recesses 50b to cover the second principal plane 10b. Minute uneven structures 51 are formed at surfaces of the recesses 50b of the striped structure 50.

As illustrated in FIG. 16, at a surface of a second principal plane 13b of the light-transmissive member 13, a striped structure 50A corresponding to the striped structure 50 may be formed to be along the recesses and projections on the second principal plane 10b of the substrate 10.

Although not illustrated, the recesses 50b of the substrate 10 may be filled with the light-transmissive member 13, and the second principal plane 13b in contact with a medium outside the light-transmissive member 13 may be flat.

At the surfaces of the recesses 50b of the substrate 10, the minute uneven structures 51 are formed. However, at a surface of each of recess 50b of the light-transmissive member 13, no minute uneven structure 51 may be formed.

The refractive index n0 of the light-transmissive member 13 may satisfy the relationship nt<n0<n1, where nt represents the refractive index of the medium with which the second principal plane 13b provided with the striped structure 50A is in contact, and n1 represents the refractive index of the substrate 10.

In the present variation, an n-side electrode 30 is formed directly on an exposed region of an n-type nitride semiconductor layer 21 on the semiconductor stacked structure 10. Thus, neither the substrate 10 nor the light-transmissive member 13 needs to have conductivity.

(Fourth Variation of Second Embodiment)

A fourth variation of a second embodiment will be described below with reference to FIG. 17.

Figure 17:
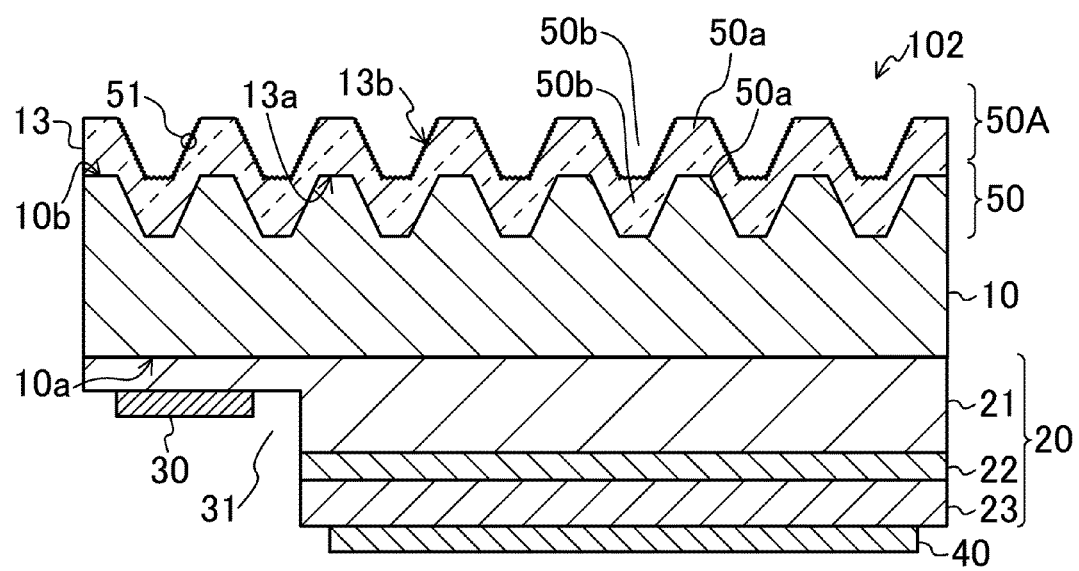
FIG. 17 is a cross-sectional view schematically illustrating a semiconductor light-emitting device according to a fourth variation of the second embodiment.

As illustrated in FIG. 17, a semiconductor light-emitting device 102 according to the fourth variation includes a light-transmissive member 13 formed on a second principal plane 10b of a substrate 10 including a striped structure 50 and recesses 50b to cover the second principal plane 10b.

A minute uneven structure 51 is formed at a surface of each of recesses 50b of a striped structure 50A provided to the light-transmissive member 13. On the other hand, no minute uneven structure 51 is formed at a surface of each recess 50b of the striped structure 50 provided to the substrate 10.

Also in the present variation, neither the substrate 10 nor the light-transmissive member 13 needs to have conductivity similar to the third variation.

(Fifth Variation of Second Embodiment)

A fifth variation of a second embodiment will be described below with reference to FIG. 18.

Figure 18:
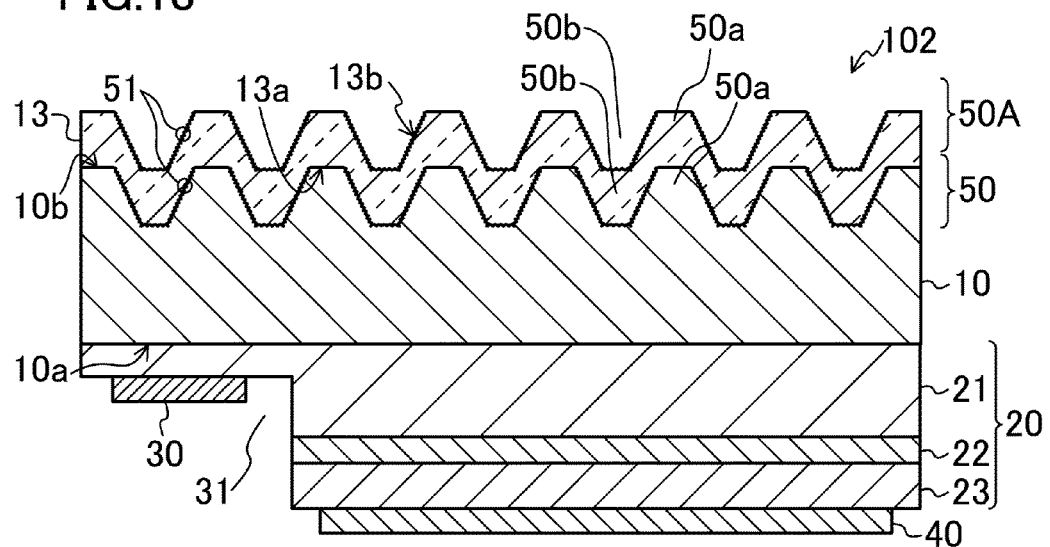
FIG. 18 is a cross-sectional view schematically illustrating a semiconductor light-emitting device according to a fifth variation of the second embodiment.

As illustrated in FIG. 18, a semiconductor light-emitting device 102 according to the fifth variation includes a light-transmissive member 13 formed on a second principal plane 10b of a substrate 10 including a striped structure 50 and recesses 50b to cover the second principal plane 10b.

Both a surface of each recess 50b of the striped structure 50 provided to the substrate 10 and a surface of each of recesses 50b of a striped structure 50A provided to the light-transmissive member 13 are provided with a minute uneven structure 51.

Also in the present variation, neither the substrate 10 nor the light-transmissive member 13 needs to have conductivity similar to the third variation.

(Sixth Variation of Second Embodiment)

A sixth variation of a second embodiment will be described with reference to FIG. 19.

Figure 19:
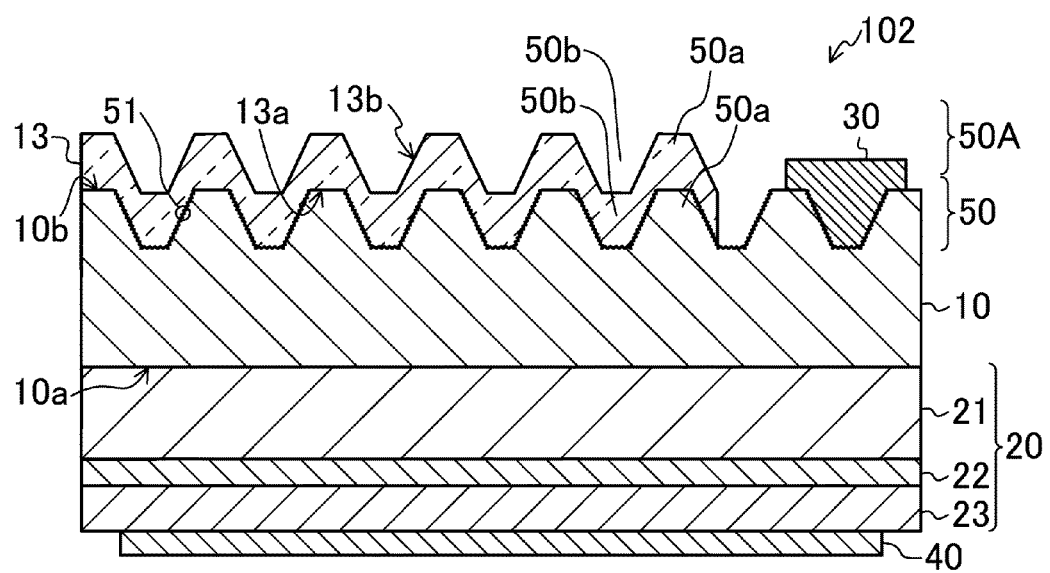
FIG. 19 is a cross-sectional view schematically illustrating a semiconductor light-emitting device according to a sixth variation of the second embodiment.

As illustrated in FIG. 19, a semiconductor light-emitting device 102 according to the sixth variation includes a light-transmissive member 13 formed on a second principal plane 10b of a substrate 10 including a striped structure 50 and recesses 50b to cover the second principal plane 10b. Minute uneven structures 51 are formed at surfaces of the recesses 50b of the striped structure 50. In the present variation, no minute uneven structure 51 is formed at surfaces of recesses 50b of the light-transmissive member 13. However, minute uneven structures 51 may be formed at the surfaces of the recesses 50b of the light-transmissive member 13.

The light-transmissive member 13 is partially removed to expose a region of the second principal plane 10b of the substrate 10. An n-side electrode 30 is formed directly on the region of the second principal plane 10b of the substrate 10 exposed from the light-transmissive member 13.

The light-transmissive member 13 may fill the recesses 50b of the striped structure 50 of the substrate 10, and may have a flat second principal plane 13b in contact with an outside medium.

In the present variation, the substrate 10 has to have conductivity. Therefore, for example, a semiconductor substrate such as GaN, SiC, or ZnO can be used as the substrate 10.

Since no recess 31 needs to be formed in a semiconductor stacked structure 20 of the semiconductor light-emitting device 102, the structure of the device is simple, which can reduce fabrication costs.

(Seventh Variation of Second Embodiment)

A seventh variation of a second embodiment will be described below with reference to FIG. 20.

Figure 20:
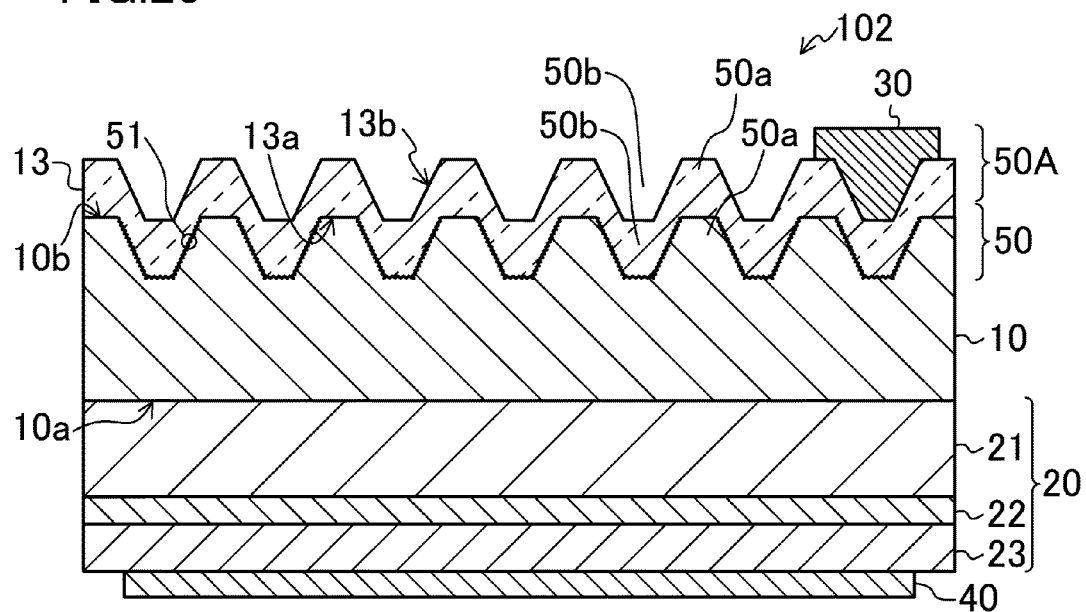
FIG. 20 is a cross-sectional view schematically illustrating a semiconductor light-emitting device according to a seventh variation of the second embodiment.

As illustrated in FIG. 20, a semiconductor light-emitting device 102 according to the seventh variation includes a light-transmissive member 13 formed on a second principal plane 10b of a substrate 10 including a striped structure 50 and recesses 50b to cover the second principal plane 10b. An n-side electrode 30 is selectively formed on the light-transmissive member 13. Minute uneven structures 51 are formed at surfaces of the recesses 50b of the striped structure 50 provided to the substrate 10. In the present variation, no minute uneven structure 51 is formed at surfaces of recesses 50b of the light-transmissive member 13. However, minute uneven structures 51 may be formed at the surfaces of the recesses 50b of the light-transmissive member 13.

The light-transmissive member 13 may fill the recesses 50b of the striped structure 50 of the substrate 10, and may have a flat second principal plane 13b in contact with an outside medium.

In the present variation, the light-transmissive member 13 and the substrate 10 have to have conductivity. A semiconductor material such as SiC or ZnO, or a transparent electrode made of, for example, indium tin oxide (ITO) can be used as a material for the light-transmissive member 13. For example, a semiconductor substrate such as GaN, SiC, or ZnO can be used as the substrate 10.

Since no recess 31 needs to be formed in a semiconductor stacked structure 20 of the semiconductor light-emitting device 102, the structure of the device is simple, which can reduce fabrication costs.

As described above, in the present embodiment and variations thereof, in a nitride semiconductor light-emitting device including an active layer 22 which emits polarized light, striped structures 50, 50A are formed in a position intersecting a light extraction path, and the angle θ formed between the polarization direction of the active layer 22 and the extension direction of the striped structures 50, 50A is set in the range from 0° to 45°. Additionally, the minute uneven structures 51 are formed at the surfaces of at least either of the recesses 50b forming the striped structure 50 or the recesses 50b forming the striped structure 50A to improve the luminous intensity distribution and the light output.

Moreover, in the present embodiment and variations thereof, the light-transmissive member 13 is illustrated as one layer, but the light-transmissive member 13 may include a plurality of layers. In this case, the striped structures 50, 50A and the minute uneven structures 51 of the surfaces of the recesses 50b of the striped structures 50, 50A may be formed at the substrate 10, or may be formed at any one or a plurality of layers included in the light-transmissive member 13.

Although not illustrated, the striped structures 50, 50A may have any cross-sectional shape illustrated in FIGS. 4A-4H.

Third Embodiment

A third embodiment will be described below with reference to the drawings.

Figure 21:
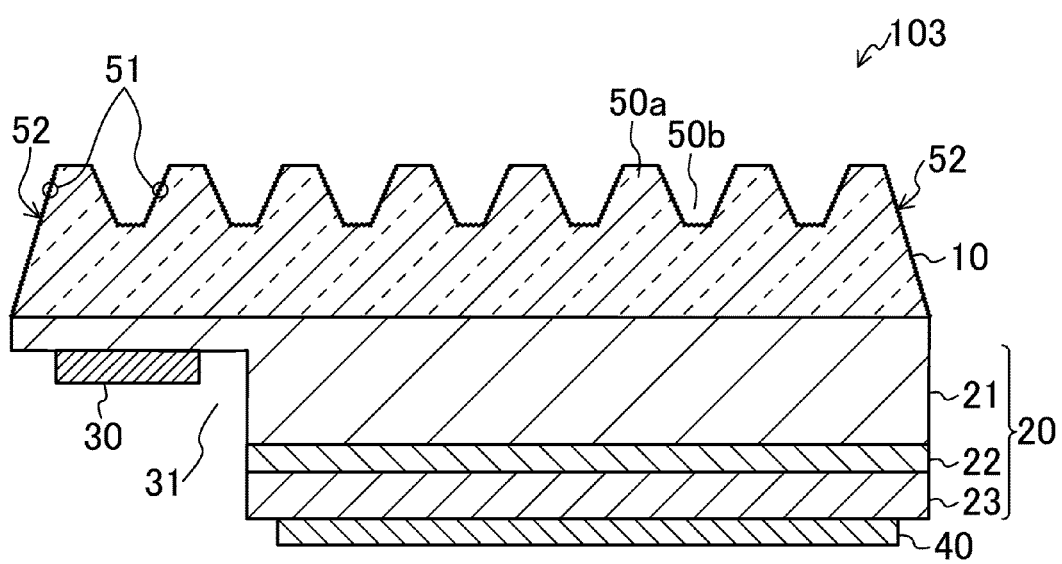
FIG. 21 is a cross-sectional view schematically illustrating a semiconductor light-emitting device according to a third embodiment.

FIG. 21 illustrates a cross-sectional configuration of a semiconductor light-emitting device according to a third embodiment in a direction corresponding to the X-X direction of, for example, FIG. 4A. In the following description, description of elements common to the first embodiment will be omitted, and structural differences and differences in the fabrication method will be described.

As illustrated in FIG. 21, a semiconductor light-emitting device 103 according to the third embodiment includes a substrate 10 having a side surface formed as an inclined surface 52 provided with a minute uneven structure 51. In this respect, the configuration of the third embodiment is different from that of the first embodiment. The side surface of the substrate 10 has the inclined surface 52, and the minute uneven structure 51 is further formed at the inclined surface 52, so that the extraction efficiency of light from the side surface of the semiconductor light-emitting device (semiconductor chip) 103 is improved.

The semiconductor light-emitting device 103 according to the present embodiment can be fabricated by, for example, the following method.

First, in a manner similar to the method used for the semiconductor light-emitting device 101 according to the first embodiment illustrated in FIGS. 3A-3D, a back surface of a substrate 10 at the wafer level is, for example, polished to reduce the thickness of the substrate 10. Then, when the wafer is singulated into semiconductor chips by dicing, conditions for laser beam irradiation which are similar to those used in polishing the back surface are used, so that the side surface of the substrate 10 becomes the inclined surface 52.

When the side surface of the substrate 10 according to the present embodiment is formed as an inclined surface 52, and at the inclined surface 52, the minute uneven structure 51 is further formed, the effect of improving light extraction is produced. Similar effect can be obtained in any of the first embodiment and the second embodiment when the side surface of the substrate 10 of the first embodiment and the second embodiment is formed as an inclined surface 52, and a minute uneven structure 51 is further formed at the inclined surface 52.

In the embodiments and variations thereof, the minute uneven structures (textures) 51 do not need to be formed at the surfaces (inner surfaces) of all the recesses 50b forming the striped structures 50, 50A. For example, the minute uneven structures 51 do not need to be formed at surfaces of some of the recesses 50b.

First Example

As a first example, formation of a striped structure by a thermal melting method using a high-density pulsed laser beam was considered.

Figure 22:
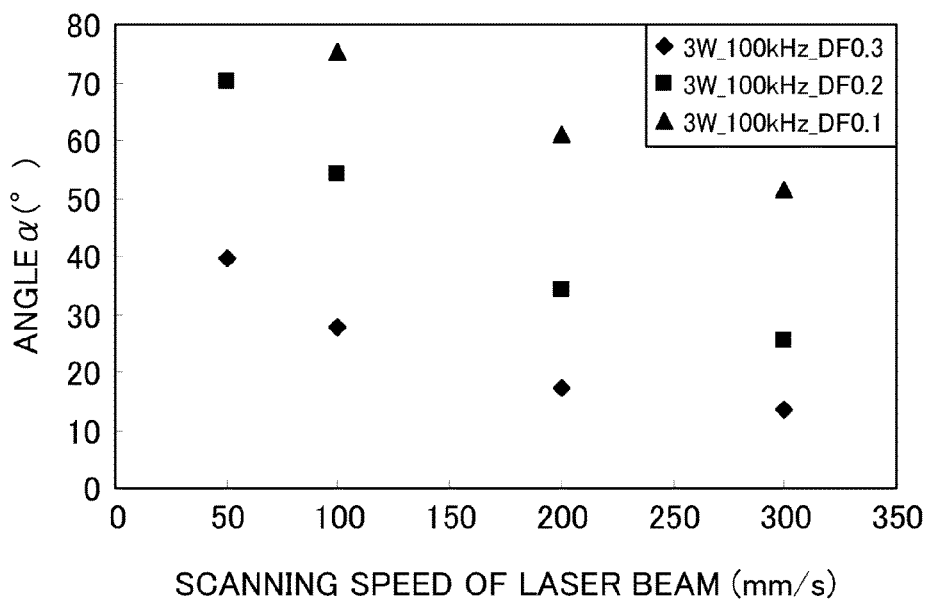
FIG. 22 is a graph illustrating the relationship between the scanning speed of a high-density pulsed laser beam and the angle α in a method for fabricating a semiconductor light-emitting device according to a first example.

FIG. 22 illustrates the relationship between the scanning speed of a high-density pulsed laser and an angle α. Here, the angle α refers to, for example, the angle formed between the normal line to the principal plane of the substrate 10 and the wall surface of the recess 50a. The oscillation condition of a laser beam is fixed, and focal point of the laser beam is purposely moved away from the substrate 10, thereby increasing the diameter D of the laser beam, so that it is possible to process the substrate such that the angle α is greater than 0°. In the present example, the distance by which the focal point of the laser beam is moved away from the focal position is hereinafter referred to as "DF distance." For example, "DF=0.1 mm" means that the focal point distance of the laser beam is moved away by 0.1 mm from a top surface of the substrate 10.

In FIG. 22, black triangles (▲), black squares (■), and black diamonds (♦) respectively represent angles α when DF=0.1 mm, angles α when DF=0.2 mm, and angles α when DF=0.3 mm. As shown in the expression (5), the angle α can be obtained with the diameter D and height h of the laser beam. Here, the height h represents the depth of the recess 50b. FIG. 22 shows that when the scanning speed of the laser beam is lowered, the angle α increases. A method for increasing the angle α includes, reducing the DF distance, and increasing the output of the laser beam, in addition to lowering the scanning speed of the laser beam. When the output of the laser beam is increased, the height h increases, so that expression (5) shows that the angle α increases.

$$\alpha = 2 \times \text{height } h/\text{diameter } D \text{ of laser beam} \quad \text{Expression (5)}$$

Figure 23:
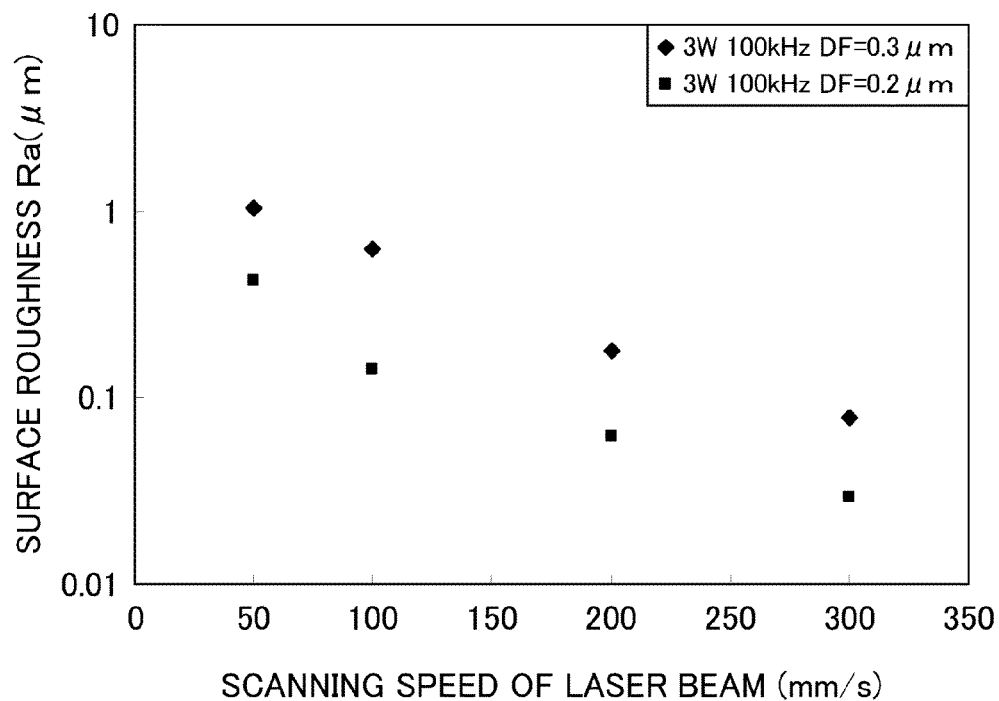
FIG. 23 is a graph illustrating the relationship between the scanning speed of a high-density pulsed laser beam and the surface roughness Ra in the method for fabricating the semiconductor light-emitting device according to the first example.

FIG. 23 illustrates the relationship between the scanning speed of the laser beam and the surface roughness Ra. Measured points, i.e., black squares (■) and black diamonds (♦) respectively represent the surface roughnesses Ra when DF=0.2 mm and the surface roughnesses Ra when DF=0.3 mm. When the scanning speed of the laser beam is increased, the surface roughness Ra lowers, and thus the surface of each recess 50b approximates a smooth surface.

With reference to FIGS. 8B and 9C, it has been described that providing the minute uneven structure 51 on the inner surface of the light extraction surface can increase the diffused proportion of transmitted light. The minute uneven structure 51 may have a surface roughness which is substantially equal to the emission wavelength of the semiconductor light-emitting device. This improves scattering of light, so that the diffused proportion of transmitted light increases to improve the light extraction efficiency, thereby reducing the asymmetry of light distribution.

As described above, when a GaN substrate is processed using a high-density pulsed laser beam, the shape and the surface roughness of the recesses 50b can be controlled by adjusting the scanning speed and the DF distance of the laser beam. Specifically, when the surface roughness Ra of the recess 50b is increased, the scanning speed of the laser beam may be lowered, or the focal position of the laser beam may be moved away from the substrate 10. When the surface roughness Ra of the recess 50b is reduced, the scanning speed of the laser beam may be increased, or the focal position of the laser beam may be brought close to the substrate 10.

When the angle α formed between the normal line to the principal plane of the substrate 10 and the wall surface of the recess 50b is reduced, the scanning speed of the laser beam may be increased or the focal position of the laser beam may be moved away from the substrate 10. In contrast, when the angle α is increased, the scanning speed of the laser beam may be lowered, or the focal position of the laser beam may be brought closer to the substrate 10.

As an example, the angle α can be controlled in the range from 15° to 75° by setting the scanning speed of the laser beam in the range from 50 mm/s to 300 mm/s. Moreover, in the range in which the scanning speed of the laser beam is not less than 50 mm/s and not more than 300 mm/s, the surface roughness Ra of the recess 50b can be controlled in the range from about 20 nm to 1 μm.

Figure 24:
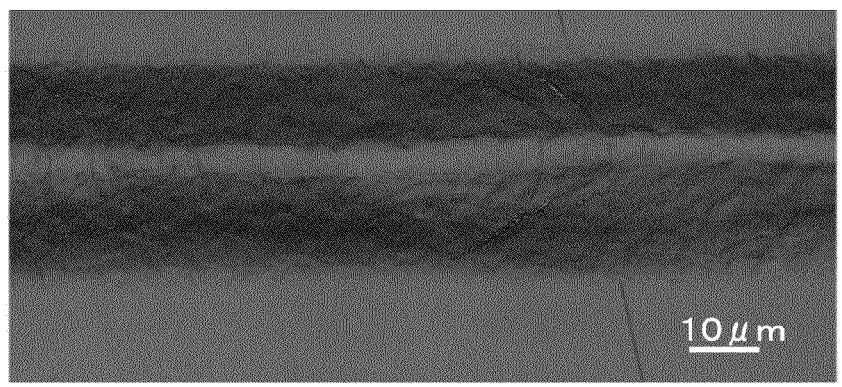
FIG. 24 is a micrograph taken after a process with a high-density pulsed laser beam in the method for fabricating the semiconductor light-emitting device according to the first example.

FIG. 24 is a micrograph of a top surface of an m-plane GaN substrate, where the output of the laser beam was 3 W, the frequency was 100 kHz, the DF was 0.3 μm, and the scanning speed of the laser beam was 200 mm/s. FIG. 24 shows that the width of the recess is 30 μm, and that the wall surface of the recess is rough. As illustrated in FIG. 24, the wall surface of the recess has a minute uneven structure (texture), and the surface roughness Ra of the wall surface is about 0.15 μm. Therefore, when the scanning speed of the laser beam is not less than 200 mm/s, the light extraction efficiency can be appropriately and reliably improved.

Second Example

A semiconductor light-emitting device according to a second example will be described below with reference to FIGS. 3A-3D. First, a method for fabricating a semiconductor light-emitting device 101 included in the semiconductor light-emitting device according to the second example will be schematically described.

First, a 2-μm-thick n-type nitride semiconductor layer made of n-type GaN, an active layer having a three-period quantum well structure including a quantum well layer made of InGaN and a barrier layer made of GaN, and a 0.5-μm-thick p-type nitride semiconductor layer made of p-type GaN were formed on an n-type GaN substrate at a wafer level and having an m-plane as a principal plane by, for example, MOCVD.

A Ti/Al layer was formed as an n-side electrode, and an Ag layer was formed as a p-side electrode. Thereafter, the back surface of the n-type GaN substrate was polished to reduce the thickness of the n-type GaN substrate to a thickness of 100 μm. Thus, a semiconductor light-emitting device structure was formed.

Then, a striped structure including projections and recesses and minute uneven structures at least on surfaces of the recesses were formed by the thermal melting method using a high-density pulsed laser beam described in the first example. Specifically, the moving amount of the laser beam was 20 μm, the depth of each recess was 10 μm, the cross-sectional structure of recesses/projections was substantially equal to that of FIG. 4E.

Subsequently, on the back surface of the substrate (wafer), a striped structure was formed, and chip separation grooves were formed. Along the separation grooves of the wafer, the wafer was divided into chips, and then, the divided chips were mounted on a mounting substrate made of AlN. By the above-described method, the semiconductor light-emitting device was fabricated.

Here, Sample 1 is a semiconductor light-emitting device in which the extension direction of the projections and the recesses of the striped structure is set in the a-axis direction, i.e., to 0° relative to the polarization direction. Sample 2 is a semiconductor light-emitting device in which the extension direction of the projections and the recesses of the striped structure is set to 45° relative to the a-axis direction, i.e., 45° relative to the polarization direction. Sample 3 is a semiconductor light-emitting device in which the extension direction of the projections and the recesses of the striped structure is set to 90° relative to the a-axis direction, i.e., 90° relative to the polarization direction. Sample 4 is a semiconductor light-emitting device including neither a striped structure nor a minute uneven structure. That is, the light extraction surface serving as the back surface of the substrate of Sample 4 is a specular surface.

Figure 25:
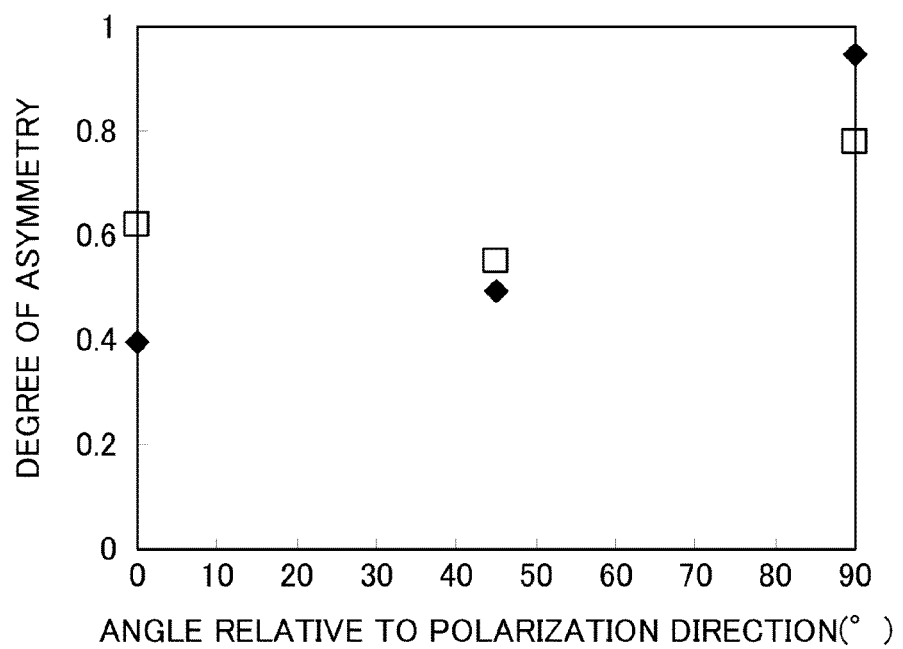
FIG. 25 is a graph illustrating the relationship between the angle of the extension direction of the striped structure relative to the polarization direction of light and the degree of asymmetry of a semiconductor light-emitting device according to a second example.

The asymmetry of the luminous intensity distribution of the fabricated semiconductor light-emitting devices was evaluated. FIG. 25 shows angles formed between the polarization direction of light from the active layer and the extension direction of the striped structure. FIG. 25 also shows the degree of reduction in the average degree of asymmetry and the maximum degree of asymmetry. In FIG. 25, white squares (□) represent the maximum degree of asymmetry, and black diamonds (♦) represent the average degree of asymmetry. Here, the degree of asymmetry is defined. The degree of asymmetry is a value obtained by normalizing a difference between the luminous intensity in the a-axis direction and the luminous intensity in the c-axis direction by using the luminous intensity in the m-axis direction, i.e., the luminous intensity at 0°, where the a-axis and the c-axis are both inclined by the same angle from a direction of the normal line to the m-plane serving as a principal plane. Here, the degree of asymmetry is defined at angles from −90° to +90°. The maximum degree of asymmetry refers to a maximum value of the degree of the asymmetry in the range from −90° to +90°. The average degree of asymmetry refers to a value obtained by averaging the degree of asymmetry in the range from −90° to +90°. In FIG. 25, the degree of reduction in the degree of asymmetry is shown by using the normalization relative to Sample 4 in which light extraction surface is a specular surface.

In FIG. 25, when the angle formed between the polarization direction of light from the active layer and the extension direction of the striped structure is 90°, the maximum degree of asymmetry is reduced compared to the case of the specular surface because the striped structure and the minute uneven structure are provided. However, when the angle formed between the polarization direction of light from the active layer and the extension direction of the striped structure is 90°, the asymmetry of the polarization direction is not reduced because the striped structure is provided in a direction perpendicular to the polarization direction, and thus the asymmetry is substantially equal to that in the case of the specular surface. Therefore, the maximum degree of the asymmetry is low, and the average degree of asymmetry is high.

FIG. 25 shows that when the angle formed between the polarization direction of light from the active layer and the extension direction of the striped structure is not less than 0° and not more than 45°, the maximum degree of asymmetry and the average degree of asymmetry as the degrees of asymmetry can be reduced to ½ of those in the case of the specular surface.

Next, the radiation intensities of the fabricated semiconductor light-emitting devices in the m-axis direction were evaluated.

Figure 26:
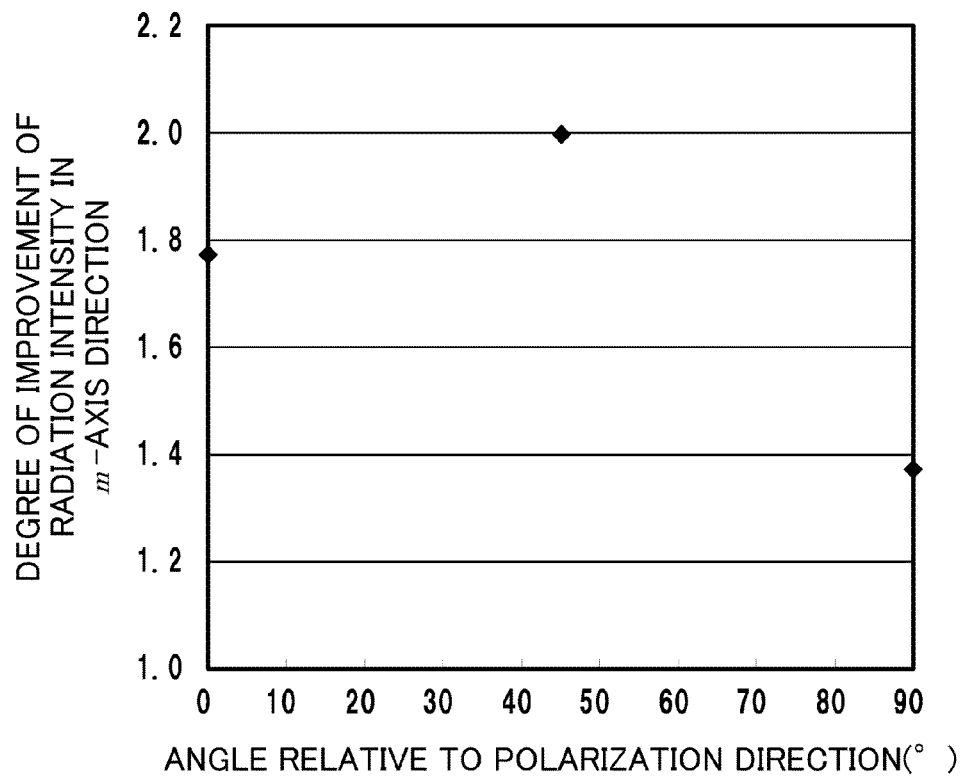
FIG. 26 is a graph illustrating the relationship between the angle in the extension direction of the striped structure relative to the polarization direction of light and the degree of improvement of the radiation intensity in the m-axis direction of the semiconductor light-emitting device according to the second example.

FIG. 26 illustrates the relationship of angles formed between the polarization direction of light from the active layer and the extension direction of the striped structure and the degree of improvement of the radiation intensity of light in the m-axis direction. Here, the radiation intensity of light in the m-axis direction was normalized relative to Sample 4 in which the light extraction surface is a specular surface. FIG. 26 shows that when the angle formed between the polarization direction of light from the active layer and the extension direction of the striped structure is not less than 0° and not more than 45°, the radiation intensity of light can be increased to about 1.8-2 times as high as that in the case of the specular surface. When the angle of the striped structure relative to the polarization direction is 45°, the radiation intensity of light is most increased.

Next, the color shift amounts of the fabricated semiconductor light-emitting devices were evaluated.

Figure 27:
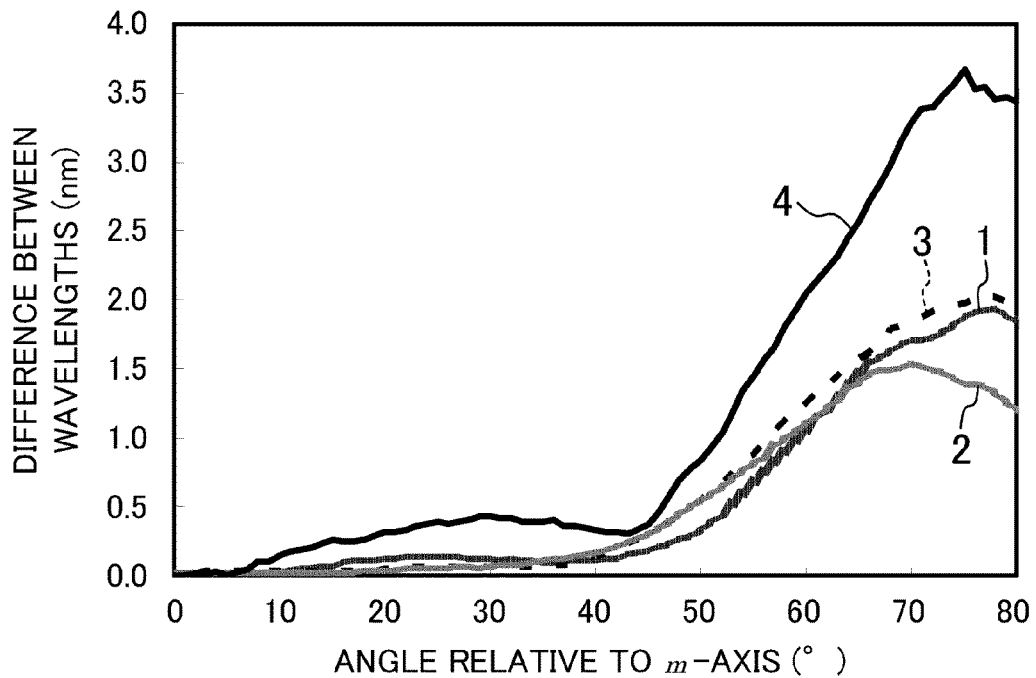
FIG. 27 is a graph illustrating the relationship between the angle relative to the m-axis ant the emission wavelength difference between the a-axis direction and the c-axis direction of the semiconductor light-emitting device according to the second example.

FIG. 27 illustrates a digitized difference between the emission wavelength in the a-axis direction and the emission wavelength in the c-axis direction, where the a-axis direction and the c-axis direction are inclined by the same angle from the m-axis. In Sample 4 in which the output surface is a specular surface, there was a large difference of about 3.5 nm between the wavelengths. Therefore, Sample 4 is not suitable for use as a light source.

In contrast, in Sample 1, Sample 2, and Sample 3 which include the striped structure including the projections and the recesses and the minute uneven structures at the surfaces of the recesses, the difference between the emission wavelength in the a-axis direction and the emission wavelength in the c-axis direction was reduced to about 2 nm.

Fourth Embodiment

A fourth embodiment will be described below with reference to the drawings.

The semiconductor light-emitting device according to each of the first to third embodiments and its variation may be used as a light source apparatus as it is.

However, the light-emitting device according to each embodiment can be suitably used as a light source apparatus (e.g., white light source apparatus) in which the wavelength band is expanded when used in combination with a resin material containing a fluorescent material for wavelength conversion.

Figure 28:
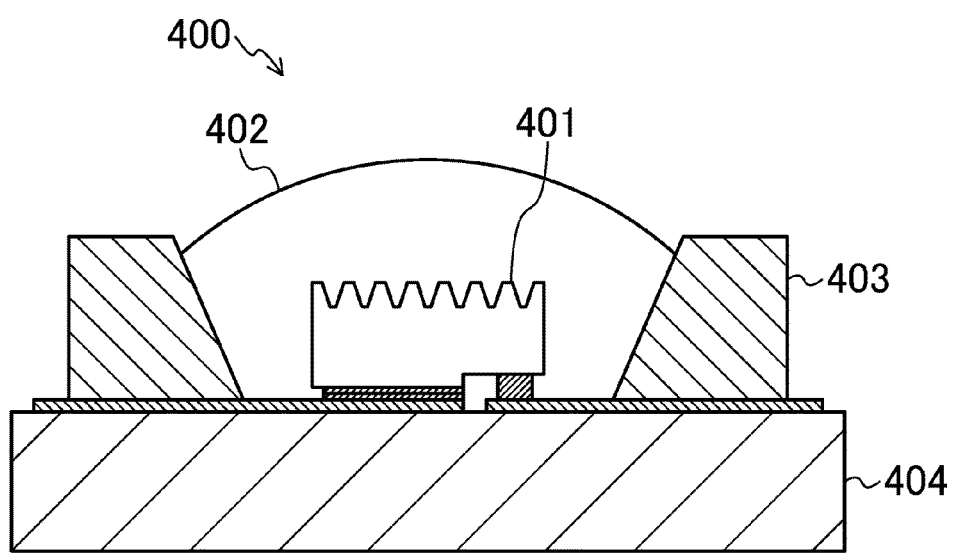
FIG. 28 is a cross-sectional view schematically illustrating a source of white light according to a fourth embodiment.

FIG. 28 schematically illustrates an example of such a white light source apparatus. A light source apparatus 400 illustrated in FIG. 28 includes a semiconductor light-emitting device 401 and a resin layer 402. The semiconductor light-emitting device 401 corresponds to any of the semiconductor light-emitting devices according to the first to third embodiments and their variations. In the resin layer 402, a fluorescent material (e.g., Yttrium Aluminum Garnet: YAG) is dispersed, the fluorescent material converting the wavelength of light output from the semiconductor light-emitting device 401 to a longer wavelength.

The semiconductor light-emitting device 401 is mounted on, for example, a holder member 404, such as a package having a top surface provided with a wiring pattern, by a so-called junction-down method such that a substrate of the semiconductor light-emitting device 401 faces upward and a light-emitting layer of the semiconductor light-emitting device 401 faces downward. Above the holder member 404, a reflection member 403 made of, for example, metal is provided to surround the light-emitting device 401.

The resin layer 402 is formed above the holder member 404 and in the reflection member 403 to cover the light-emitting device 402.

The light source apparatus 400 according to the fourth embodiment formed to have such a configuration provides a white light source apparatus with high efficiency.

As described above, the semiconductor light-emitting device according to the present disclosure includes a striped structure including projections and recesses which is formed at an output surface from which light emitted from the active layer is extracted. Therefore, the polarized light in the a-axis direction can enter the wall surfaces and the top surfaces of the recesses forming the striped structure. A minute uneven structure is further formed at an inner surface of each recess, which can improve the light extraction efficiency, so that the angle distribution of the light distribution characteristic can be reduced. That is, the anisotropy of the intensity of emitted light is more suitably controlled, and light-emitting performance can be improved.

In this specification, "m-planes" of crystal planes of the nitride semiconductor layer does not need to be planes completely parallel to the m-planes, but may be planes inclined by a predetermined angle from the m-planes. The inclination angle depends on the angle formed between the normal line to the principal plane of the nitride semiconductor layer and the normal line to the m-plane which is not inclined. The principal plane of an actual nitride semiconductor layer may be inclined from the m-plane which is not inclined toward a direction of a vector expressed by a direction based on a crystal structure, for example, a c-axis, a-axis, or <11–22> axis direction. For example, the absolute value of the inclination angle may be not more than 5° or not more than 1° in the c-axis direction. The absolute value of the inclination angle may be not more than 5° or not more than 1° in the a-axis direction. That is, in the present specification, "m-planes" include planes inclined by a predetermined angle from the m-plane which is not inclined toward a predetermined direction in the range of ±5°. In the range of such inclination angles, the principal plane (growth surface) of the nitride semiconductor layer is generally inclined from the m-plane, but a large number of m-plane regions seem to be microscopically exposed. Thus, a plane inclined at an angle of not more than 5° by absolute value from the m-plane seems to have the same characteristics as the m-plane. That is, the principal plane of the nitride-based semiconductor stacked structure may be a plane in which a large number of m-plane regions are microscopically exposed.

The present disclosure can be used for, for example, general lighting.

The invention claimed is:
1. A semiconductor light-emitting device comprising:
a nitride-based semiconductor stacked structure including an active layer which has a nonpolar plane or a semipolar plane as a principal plane and emits polarized light; and a striped structure which is provided in a position intersecting an exit path of the polarized light and includes a plurality of recesses extending parallel to each other, wherein an angle formed between an extension direction of the recesses and a polarization direction of the polarized light is not less than 25° and not more than 45°, and a minute uneven structure is provided at at least part of a surface of each recess, a depth of the minute uneven structure being shallower than a depth of each recess.

2. The semiconductor light-emitting device of claim 1, further comprising:

a substrate by which the nitride-based semiconductor stacked structure is held, wherein the striped structure is provided in the substrate.

3. The semiconductor light-emitting device of claim 2, wherein the depth of each recess is not more than ½ of a thickness of the substrate.

4. The semiconductor light-emitting device of claim 1, further comprising:

a light-transmissive member, wherein the striped structure is provided in the light-transmissive member.

5. The semiconductor light-emitting device of claim 4, further comprising:

a substrate on which the nitride-based semiconductor stacked structure is grown, wherein the light-transmissive member is provided on a surface of the substrate opposite to the nitride-based semiconductor stacked structure.

6. The semiconductor light-emitting device of claim 2, wherein the substrate is made of gallium nitride, sapphire, or silicon carbide.

7. The semiconductor light-emitting device of claim 1, wherein a region between the recesses adjacent to each other is flat.

8. The semiconductor light-emitting device of claim 1, wherein the depth of each recess is not less than $\lambda/0.628$, where $\lambda$ is a wavelength of the polarized light.

9. The semiconductor light-emitting device of claim 1, wherein

L2/L1 is not more than 1.7, where L2 is a distance between the recesses adjacent to each other, and L1 is a width of each recess.

10. The semiconductor light-emitting device of claim 1, wherein a linear cross-section roughness Ra of the minute uneven structure in the extension direction of the recesses is not less than $\lambda/30$ and not more than $\lambda \times 5$, where $\lambda$ is a wavelength of the polarized light.

11. The semiconductor light-emitting device of claim 1, wherein the principal plane of the nitride-based semiconductor stacked structure is an m-plane, and the polarization direction is an a-axis direction.

12. A method for forming a plurality of a striped structure on a surface of a nitride semiconductor light-emitting diode, the method comprising:

melting the surface of the nitride semiconductor light-emitting diode thermally to form, on the surface of the nitride semiconductor light-emitting diode, the striped structure including a plurality of recesses each having a minutes uneven structure at at least part of a surface thereof, wherein the minutes uneven structure has a shallower depth than each recess, the nitride semiconductor light-emitting diode includes an active layer having a principal plane of a non-polar or semi-polar plane and emits a polarized light, and an angle formed between an extension direction of the recesses and a polarization direction of the polarized light is not less than 25° and not more than 45°.

13. The method of claim 12, wherein the surface of the nitride semiconductor light-emitting diode is thermally melted by irradiating a part of the surface of the nitride semiconductor light-emitting diode with laser beam, and the recesses are formed at the part irradiated with the laser beam.

14. The method of claim 13, wherein the part of the surface of the nitride semiconductor light-emitting is scanned with the laser beam during the irradiation, and a scanning speed of the laser beam is not less than 200 mm/s.

15. A light source apparatus comprising:

the semiconductor light-emitting device of claim 1; and a wavelength converter containing a fluorescent material converting a wavelength of light output from the semiconductor light-emitting device.

\* \* \* \* \*